(12) United States Patent
Hwang et al.

(10) Patent No.: US 10,931,152 B2
(45) Date of Patent: Feb. 23, 2021

(54) METHOD OF MANUFACTURING MAGNETIC FIELD SHIELDING SHEET AND MAGNETIC FIELD SHIELDING SHEET FORMED THEREBY

(71) Applicant: AMOSENSE CO., LTD, Cheonan-si (KR)

(72) Inventors: Seung Jae Hwang, Incheon (KR); Kil Jae Jang, Seongnam-si (KR)

(73) Assignee: AMOSENSE CO., LTD., Cheonan-Si (KR)

( * ) Notice: Subject to any disclaimer, the term of this patent is extended or adjusted under 35 U.S.C. 154(b) by 272 days.

(21) Appl. No.: 16/225,315

(22) Filed: Dec. 19, 2018

(65) Prior Publication Data

US 2019/0148988 A1 May 16, 2019

Related U.S. Application Data

(63) Continuation-in-part of application No. 15/745,444, filed as application No. PCT/KR2016/007680 on Jul. 14, 2016, now Pat. No. 10,673,269.

(30) Foreign Application Priority Data

Jul. 20, 2015 (KR) .......................... 10-2015-0102524

(51) Int. Cl.
*H02J 50/70* (2016.01)
*H02J 50/20* (2016.01)
(Continued)

(52) U.S. Cl.
CPC .............. *H02J 50/70* (2016.02); *H01F 27/36* (2013.01); *H01F 38/14* (2013.01); *H01F 41/024* (2013.01);
(Continued)

(58) Field of Classification Search
None
See application file for complete search history.

(56) References Cited

U.S. PATENT DOCUMENTS

| 2012/0024587 A1 | 2/2012 | Kiyota et al. |
| 2014/0017486 A1* | 1/2014 | Yoo ........................ B32B 27/36 428/325 |

(Continued)

FOREIGN PATENT DOCUMENTS

| JP | 2009-290075 | 12/2009 |
| KR | 2011-0111425 | 10/2011 |

(Continued)

OTHER PUBLICATIONS

International Search Report and Written Opinion issued in International Patent Application No. PCT/KR2016/007680, dated Nov. 1, 2016.

*Primary Examiner* — Jared Fureman
*Assistant Examiner* — Joel Barnett
(74) *Attorney, Agent, or Firm* — Norton Rose Fulbright US LLP

(57) ABSTRACT

Disclosed is a method of manufacturing a magnetic field shielding sheet. The method of manufacturing a magnetic field shielding sheet formed as a plurality of divided pieces includes preparing a magnetic sheet formed of a magnetic material and having a first area and punching the magnetic sheet to form a shielding sheet using a mold such that the shielding sheet having a second area which is narrower than the first area is separated from the magnetic sheet, wherein the punching of the magnetic sheet to form the shielding sheet includes forming at least one linear slit in an inner region of the second area using the mold such that the shielding sheet is divided into a plurality of pieces while the shielding sheet is separated from the magnetic sheet to have the second area.

16 Claims, 15 Drawing Sheets

(51) Int. Cl.
    *H02J 50/10*     (2016.01)
    *H01Q 1/52*     (2006.01)
    *H01F 27/36*     (2006.01)
    *H01F 27/26*     (2006.01)
    *H05K 9/00*     (2006.01)
    *H01F 38/14*     (2006.01)
    *H01F 41/02*     (2006.01)
    *H02J 7/02*     (2016.01)

(52) U.S. Cl.
    CPC ......... *H01F 41/0226* (2013.01); *H01Q 1/526* (2013.01); *H02J 50/10* (2016.02); *H02J 50/20* (2016.02); *H05K 9/0075* (2013.01); *H01F 27/263* (2013.01); *H02J 7/025* (2013.01)

(56) References Cited

U.S. PATENT DOCUMENTS

2016/0064814 A1*   3/2016   Jang ..................... H02J 50/12
                                                                                       343/842
2016/0345474 A1*   11/2016   Oh ..................... H04B 5/0031

FOREIGN PATENT DOCUMENTS

| KR | 2013-0050633 | 5/2013 |
|---|---|---|
| KR | 10-1272397 | 6/2013 |
| KR | 2014-0109336 | 9/2014 |

* cited by examiner (a)

(b)

(c)

(d)

(e)

(f)

(g)

(h)

METHOD OF MANUFACTURING MAGNETIC FIELD SHIELDING SHEET AND MAGNETIC FIELD SHIELDING SHEET FORMED THEREBY

CROSS-REFERENCE TO RELATED APPLICATION

This application is a continuation-in-part of U.S. application Ser. No. 15/745,444, filed Jan. 17, 2018, which is a national phase application under 35 U.S.C. § 371 of International Application No. PCT/KR2016/007680, filed Jul. 14, 2016, which claims priority to Korean Patent Application No. 10-2015-0102524, filed Jul. 20, 2015. The contents of the referenced patent applications are incorporated into the present application by reference.

BACKGROUND

1. Technical Field

The present disclosure relates to a magnetic field shielding, and more particularly, to a magnetic field shielding unit that shields a magnetic field to prevent external leakage and condense the magnetic field in a desired direction.

2. Discussion of the Related Art

Recently, a portable terminal has a wireless charging function for wirelessly charging a built-in battery. The wireless charging can be performed by a wireless power receiving module built in the portable terminal, and a wireless power transmitting module for wirelessly supplying power to the wireless power receiving module.

In this case, the wireless power transmitting module and the wireless power receiving module include a wireless power transfer antenna for transmitting or receiving wireless signal, and a shielding sheet to shield a magnetic field generated from the wireless power transfer antenna to prevent external leakage and condense the magnetic field in desired direction.

As for the shielding sheet, a magnetic member is generally used. For example, a fluorine resin protective film such as a polyethylene terephthalate (PET) may be attached to the magnetic member to prevent the shielding sheet from being exposed.

However, the conventional protective film cannot satisfactorily perform a function as a protective film because strength of the raw material for the protective film is so weak that it may be torn or scratched easily by an external impact.

In recent years, an electronic device such as the portable terminal become thinner and smaller, and accordingly, components to be incorporated in the electronic device are also required to be thinner and smaller. For example, the wireless power receiving module to be incorporated in the portable terminal usually has been made to have a very thin overall thickness, about 0.3 mm, which will become thinner in the future.

Accordingly, research and development are carried out in various aspects in order to satisfy the characteristics required for such a very thin thickness. For this, there is a need for a solution to improve the characteristics while maintaining the same as or thinner thickness than that of a conventional product by making the components constituting the wireless power receiving module to be multifunctional, that is, by changing a material or a shape of a component having only one function, so as to make the component to have an additional function, in addition to its original function, for assisting its neighboring component in cooperation with other components.

Meanwhile, a magnetic field shielding sheet is used for a portable terminal in order to prevent heat from being generated by an eddy current caused by a magnetic field and to improve performance thereof.

That is, since near field communication (NFC) and wireless charging are basically performed through non-contact transmission methods, the magnetic field shielding sheet formed of a magnetic material is used in order allow a magnetic field generated by a first coil of a transmission apparatus to be condensed on a second coil of a receiving apparatus.

A magnetic material, such as an amorphous metal ribbon, ferrite, or a polymer sheet containing magnetic powder, is generally used for the magnetic field shielding sheet.

In this case, a technology in which a magnetic field shielding sheet is formed as a plurality of divided pieces in order to significantly reduce a loss due to an eddy current has been proposed.

Accordingly, the magnetic field shielding sheet divided into the plurality of pieces may prevent the magnetic field from affecting a main body and a battery of the portable terminal and also may improve a quality factor (Q) of the second coil so that a communication distance and a charging efficiency can increase.

For example, the magnetic field shielding sheet may be divided into the plurality of pieces through a flaking process.

That is, in the flaking process, the magnetic field shielding sheet may pass between a metal roller including an external surface having a plurality of irregularities or sphere balls and a rubber roller disposed to face the metal roller so that the magnetic field shielding sheet can be divided into the plurality of pieces.

Accordingly, since the additional flaking process is added in order to divide the magnetic field shielding sheet into the pieces, there is a problem in that a production cost increases due to an additional process in the manufacturing process.

In addition, in the flaking process performed by the pair of rollers, since the whole area of the magnetic field shielding sheet is pressed while passing between the pair of rollers, there is a problem in adjusting sizes of the pieces. Accordingly, it is difficult to produce the magnetic field shielding sheet having various permeabilities through the conventional flaking process.

SUMMARY

To solve the above problem and defects, it is an object of the present disclosure to provide a magnetic field shielding unit of which protective film to be attached to an exposed surface of a shielding sheet is replaced with a metallic material so that the shielding sheet can have an increased rigidity due to the metallic protective film itself and thus effectively prevent a damage by an external impact, thereby enhancing a protecting function against an external environment.

In addition, it is another object of present disclosure to provide the magnetic field shielding unit which can enhance a heat radiating performance of the wireless power transfer module by adding a heat radiating function and a protective function by replacing a protective film of the shielding sheet to attached to a surface of the shielding sheet with a metallic thin film having thermal conductivity.

In addition, it is still another object of the present disclosure to provide a method of manufacturing a magnetic field shielding sheet in which at least one linear slit is formed during a punching process such that a magnetic field shielding sheet may be divided into a plurality of pieces by the linear slit and cracks caused by the linear slit, and a magnetic field shielding sheet manufactured thereby.

In addition, it is yet another object of the present disclosure to provide a method of manufacturing a magnetic field shielding sheet of which a permeability may be variously adjusted by adjusting sizes and the number of pieces divided from each other, and a magnetic field shielding sheet manufactured thereby.

To accomplish the above and other objects of the present disclosure, there is provided that a magnetic field shielding unit which includes a magnetic field shielding sheet; and a metallic protecting member attached to a surface of the magnetic field shielding sheet via an adhesive layer for protecting the magnetic field shielding sheet in addition to for radiating heat generated from a heat source.

In an embodiment of the present disclosure, the metallic protecting member may be made of a metallic thin film having a thermal conductivity of 200 W/m·K or more. Preferably, the metallic thin film may be made of aluminum or copper foil.

In an embodiment of the present disclosure, a thickness of the metallic protecting member may be 1/30 to 1/3 of a thickness of the magnetic field shielding sheet.

In an embodiment of the present disclosure, the metallic protecting member may include at least one slit having a predetermined length.

In an embodiment of the present disclosure, the slit may be formed on an area corresponding to a wireless power transfer antenna for transmitting wireless power.

In an embodiment of the present disclosure, the slit may be formed in a direction perpendicular to a longitudinal direction of a pattern constituting the wireless power transfer antenna, or in a direction perpendicular to a tangent of a pattern constituting the wireless power transfer antenna.

In an embodiment of the present disclosure, the adhesive layer may include a thermal conductive component.

According to an another embodiment of the present disclosure, the metallic protecting member may include a substrate layer made of a metallic material and a coating layer which is coated for radiation on at least one side of the substrate layer. In an embodiment of the present disclosure, the coating layer may include at least one selected from ceramics and metallic oxides.

In an embodiment of the present disclosure, the magnetic field shielding sheet may include any one of a ribbon sheet including at least one of an amorphous alloy and a nanocrystal alloy, a ferrite sheet, and a polymer sheet. The ferrite sheet may be a Mn—Zn ferrite sheet or a Ni—Zn ferrite sheet.

In an embodiment of the present disclosure, the magnetic field shielding sheet may be multi-layered ribbon sheets including at least one of an amorphous alloy and a nanocrystalline alloy.

In an embodiment of the present disclosure, the magnetic field shielding sheet may include a plurality of fine pieces which are divided, and the plurality of fine pieces may be entirely or partially insulated between neighboring fine pieces. The plurality of fine pieces may have irregular shapes.

In an embodiment of the present disclosure, the magnetic field shielding sheet may include a plurality of sheets having different characteristics in a predetermined frequency band.

Meanwhile, according to a still another embodiment of the present disclosure, a method of manufacturing a magnetic field shielding sheet formed as a plurality of divided pieces includes preparing a magnetic sheet formed of a magnetic material and having a first area and punching the magnetic sheet to form a shielding sheet using a mold such that the shielding sheet having a second area which is narrower than the first area is separated from the magnetic sheet, wherein the punching of the magnetic sheet to form the shielding sheet includes forming at least one linear slit in an inner region of the second area using the mold such that the shielding sheet is divided into a plurality of pieces while the shielding sheet is separated from the magnetic sheet to have the second area.

In an embodiment of the present disclosure, the mold may include an edge blade having a ring shape in order to form an edge of the shielding sheet and at least one linear blade in order to form the linear slit.

In an embodiment of the present disclosure, the linear slit may have a predetermined length and be formed in a thickness direction of the shielding sheet, and the shielding sheet may be divided into a plurality of pieces due to a crack caused by at least any one of the linear slit and an edge of the shielding sheet.

As an example, the shielding sheet may include a plurality of linear slits locally formed in an inner region of the shielding sheet, and the plurality of linear slits may be radially formed around a virtual center point.

As another example, the shielding sheet may include a plurality of linear slits locally formed in an inner region of the shielding sheet and spaced apart from each other, and the plurality of linear slits may include at least one or more among a first slit formed in a direction perpendicular to a width or longitudinal direction of the shielding sheet, a second slit formed in a direction parallel to the width or longitudinal direction of the shielding sheet, and a third slit obliquely formed at a predetermined angle with respect to the width or longitudinal direction of the shielding sheet.

Here, the shielding sheet may include a plurality of linear slits locally formed in an inner region of the shielding sheet and spaced apart from each other, and the plurality of linear slits may be formed not to be directly connected to each other.

In an embodiment of the present disclosure, a release film may be attached to at least any one surface of an upper surface and a lower surface of the magnetic sheet with an adhesive layer interposed therebetween, wherein the adhesive layer has a substrate of which both surfaces are coated with an adhesive agent, and the punching of the magnetic sheet to form the shielding sheet may be performed such that the edge blade passes through both of the magnetic sheet and the release film.

In an embodiment of the present disclosure, the magnetic sheet may be a single-layered ribbon sheet including at least one of an amorphous alloy and a nanocrystal alloy, or a multi-layered ribbon sheet in which ribbon sheets including at least one of an amorphous alloy and a nanocrystal alloy are stacked with an adhesive layer interposed therebetween.

Meanwhile, according to a yet another embodiment of the present disclosure, a magnetic field shielding sheet includes a shielding sheet formed of a magnetic material and is divided into a plurality of pieces, wherein the plurality of pieces include pieces in which at least some thereof have different sizes and shapes, and the pieces are divided by at least one linear slit formed in a thickness direction of the shielding sheet and a crack caused by the at least any one of the linear slit and an edge of the shielding sheet.

In an embodiment of the present disclosure, the magnetic field shielding sheet may include an adhesive layer disposed on at least any one surface of both surfaces of the magnetic field shielding sheet, wherein the adhesive layer may include a substrate of which one or both surfaces are coated with an adhesive agent.

In an embodiment of the present disclosure, the magnetic field shielding sheet may further include a release film attached to at least any one surface of both surfaces of the magnetic field shielding sheet with an adhesive layer interposed therebetween.

Meanwhile, according to a yet another embodiment of the present disclosure, a wireless power receiving apparatus includes at least one wireless power receiving antenna and the above-described magnetic field shielding sheet which is disposed on one surface of the wireless power receiving antenna, shields a magnetic field, and condenses the magnetic field in a desired direction, In addition, according to a yet another embodiment of the present disclosure, a portable terminal includes the above-described wireless power receiving apparatus.

According to the embodiments of the present disclosure, the protective film to be attached to the magnetic field shielding sheet made from a metallic material that can enhance rigidity of the heat radiating member. As a result, the protective film can prevent the magnetic field shielding sheet from being damaged by an external impact, thereby enhancing the protection function for the magnetic field shielding sheet against the external environment.

In addition, according to the embodiments of the present disclosure, the magnetic field shielding sheet can have an enhanced heat radiating performance and reduced overall thickness by replacing the protective film attached to one surface of the magnetic field shielding sheet with a metallic protecting member made from a metallic material having thermal conductivity, so as to add the heat radiating function in addition to the protecting function.

According to the embodiments of the present disclosure, the metallic protection member is formed with the slit-like structure for suppressing eddy current loss as well as the coating layer for improving the radiation performance. Thus, the heat radiating efficiency can be improved and the wireless charging efficiency can be further increased.

In addition, according to the embodiments of the present disclosure, linear slits which generate cracks in an inner region of a shielding sheet are formed during a punching process, and thus the shielding sheet divided into a plurality of pieces can be manufactured even when an additional process is not performed. Accordingly, the present disclosure can simplify a manufacturing process so as to reduce a manufacturing cost.

In addition, according to the embodiments of the present disclosure, sizes and the total number of divided pieces can be adjusted by adjusting the number of linear slits formed in the inner region of the shielding sheet, and thus the shielding sheet having various permeabilities can be manufactured. Accordingly, the present disclosure can manufacture the shielding sheet having a permeability suitable for a purpose of use.

BRIEF DESCRIPTION OF THE DRAWINGS

FIG. 12 shows sectional views showing magnetic sheets which may be used in the method of manufacturing a magnetic field shielding sheet according to the exemplary embodiment of the present disclosure, wherein FIG. 12A is a view of the magnetic sheet formed of a multi-layered ribbon sheet, and FIG. 12B is a view of the magnetic sheet formed of a single-layered ribbon sheet.

DETAILED DESCRIPTION OF THE EMBODIMENTS

Figure 1:
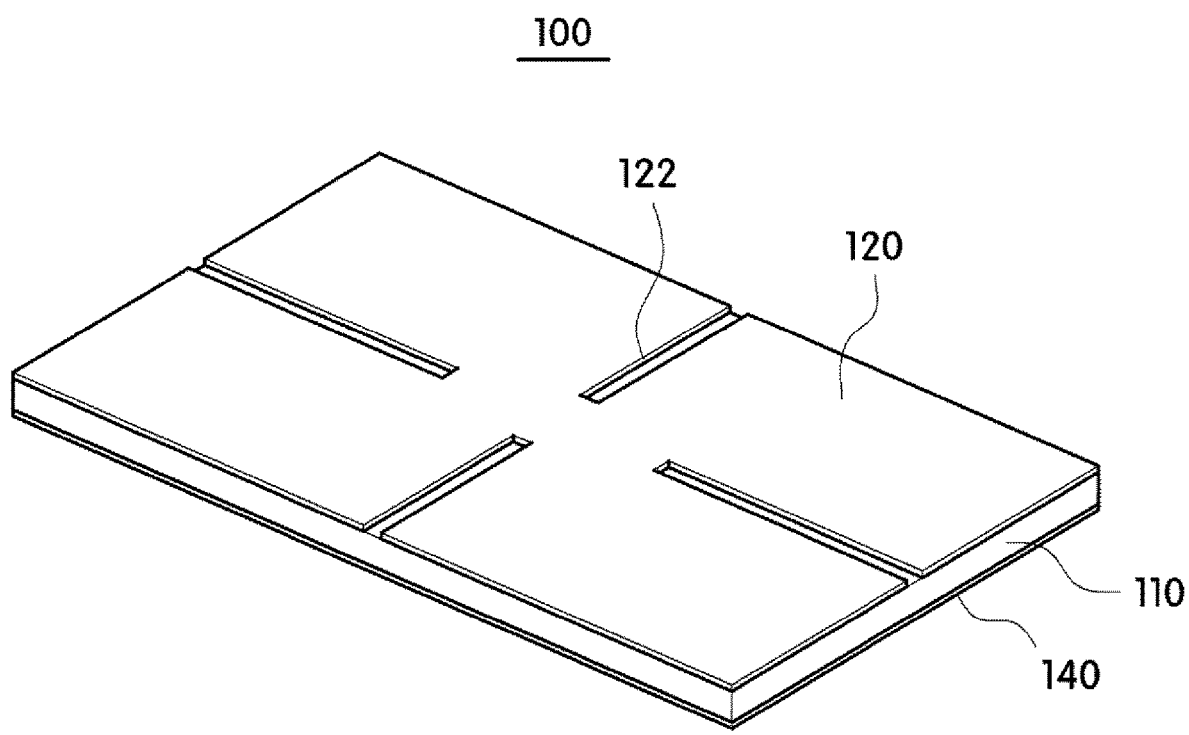
FIG. 1 is a perspective view showing a magnetic field shielding unit, according to an exemplary embodiment of the present disclosure.

Hereinafter, exemplary embodiments of the present disclosure will be described in detail with reference to the accompanying drawings, which will be readily apparent to those skilled in the art to which the present disclosure pertains. The present disclosure may be embodied in many different forms and is not limited to the embodiments described herein. In the drawings, parts not relating to the description are omitted for clarifying the present disclosure, and the same reference numerals are assigned to the same or similar components throughout the specification.

Figure 2:
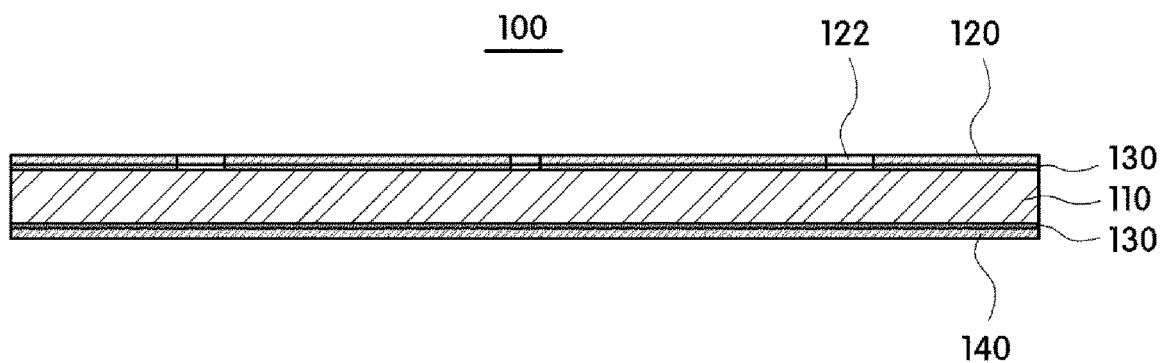
FIG. 2 is a sectional view of the magnetic field shielding unit in FIG. 1.

In an exemplary embodiment, a magnetic field shielding unit 100 may include a magnetic field shielding sheet 110 and a metallic protecting member 120 as shown in FIGS. 1 and 2.

The magnetic field shielding sheet 110 may enhance a performance of an antenna using a predetermined frequency band by shielding the magnetic field generated from the antenna to increase a condensing performance of the magnetic field.

In an exemplary embodiment, the magnetic field shielding sheet 110 may be disposed on a side of the antenna unit 10 that performs a predetermined function by transmitting or receiving a wireless signal using a predetermined frequency band.

To this end, the magnetic field shielding sheet 110 is made from a magnetic material so as to shield the magnetic field generated from the antenna unit 10.

In an exemplary embodiment, the magnetic field shielding sheet 110 may include any one of a ribbon sheet including at least one of an amorphous alloy and a nanocrystal alloy, a ferrite sheet, and a polymer sheet.

Here, the ferrite sheet may be a sintered ferrite sheet, and may include Ni—Zn ferrite or Mn—Zn ferrite. In addition, the ribbon sheet may include an Fe-based or a Co-based magnetic alloy, and the amorphous alloy or the nanocrystal alloy may include a Fe-based or Co-based magnetic alloy.

Figure 6:
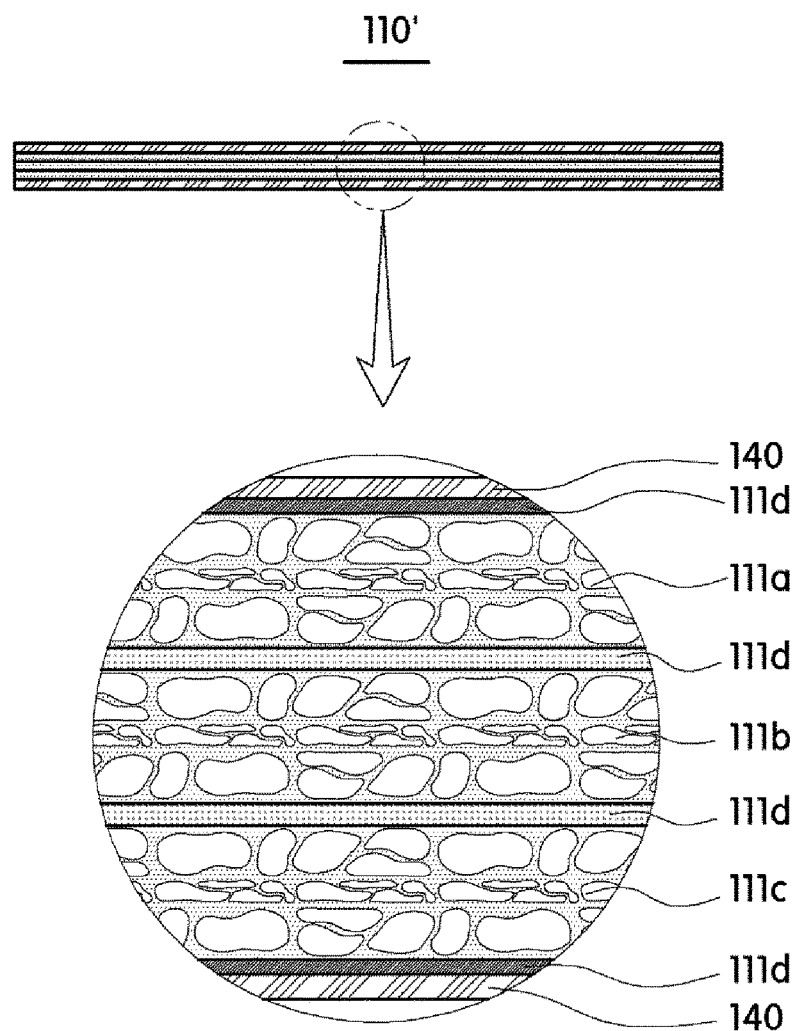
FIG. 6 is a schematic view of a shielding sheet applied to a magnetic field shielding unit, according to an exemplary embodiment of the present disclosure.

As shown in FIG. 6, the magnetic field shielding sheet 110' may be provided by stacking a plurality of magnetic sheets 111a, 111b and 111c. The magnetic field shielding sheet 110 may include a plurality of divided fine pieces so as to suppress generation of eddy currents by increasing the overall resistance, and the plurality of divided fine pieces may be totally or partially insulated from each other. The plurality of pieces may have a size of 1 μm to 3 mm, and each respective pieces may have irregular shapes.

When the magnetic field shielding sheet 110 is constructed by stacking the plurality of shielding sheets 111a, 112b, and 111c divided into fine pieces to form multi-layers, an adhesive member 111d including a nonconductive component may be disposed between adjacent sheets. Thereby, a part or the whole of the adhesive member 111d between adjacent sheets stacked on each other may permeate between the plurality of fine pieces constituting each sheet, and totally or partially insulate the neighboring fine pieces from each other. Here, the adhesive member 111d may be an inorganic-material-type adhesive agent in liquid or gel form, or may be a substrate-type in which an adhesive agent is applied to a side or both sides of a film type substrate.

For example, the magnetic field shielding sheet may be a multilayered ribbon sheet which may be formed by stacking a plurality of ribbon sheets 111a, 111b, and 111c including at least one of an amorphous alloy and a nano-crystal alloy. Each ribbon sheet 111a, 111b, or 111c may be formed of divided fine pieces having irregular shapes. The adhesive member 111d disposed between the ribbon sheets stacked on each other may permeate between the plurality of fine pieces, and totally or partially insulates the neighboring fine pieces from each other.

The antenna unit 10 may include at least one antenna for transmitting or receiving a wireless signal using a predetermined frequency band, and may be composed of a plurality of antennas 12, 13, and 14 that perform different roles using different frequency bands.

Figure 3A:
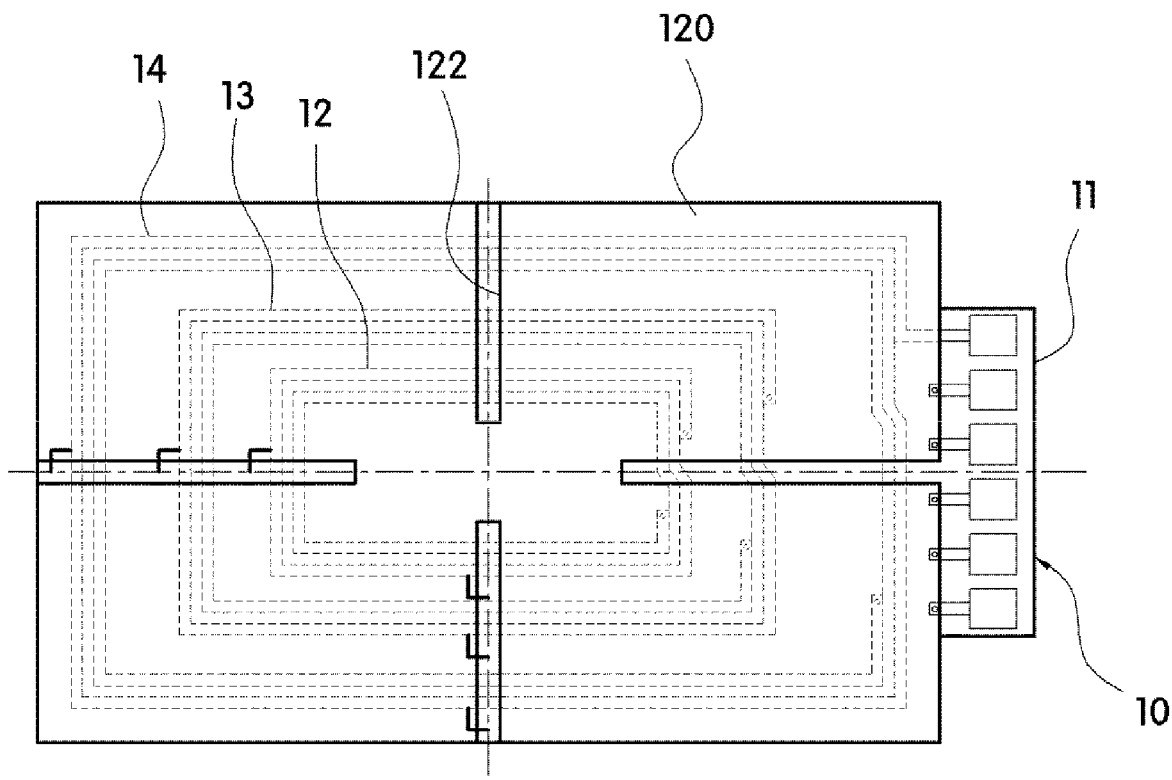
FIGS. 3A and 3B are schematic views showing a disposition relationship between a slit and a wireless power transfer antenna, respectively, when the slit is formed in a metallic protective member applied to the magnetic field shielding unit, according to exemplary embodiments of the present disclosure.
Figure 3B:
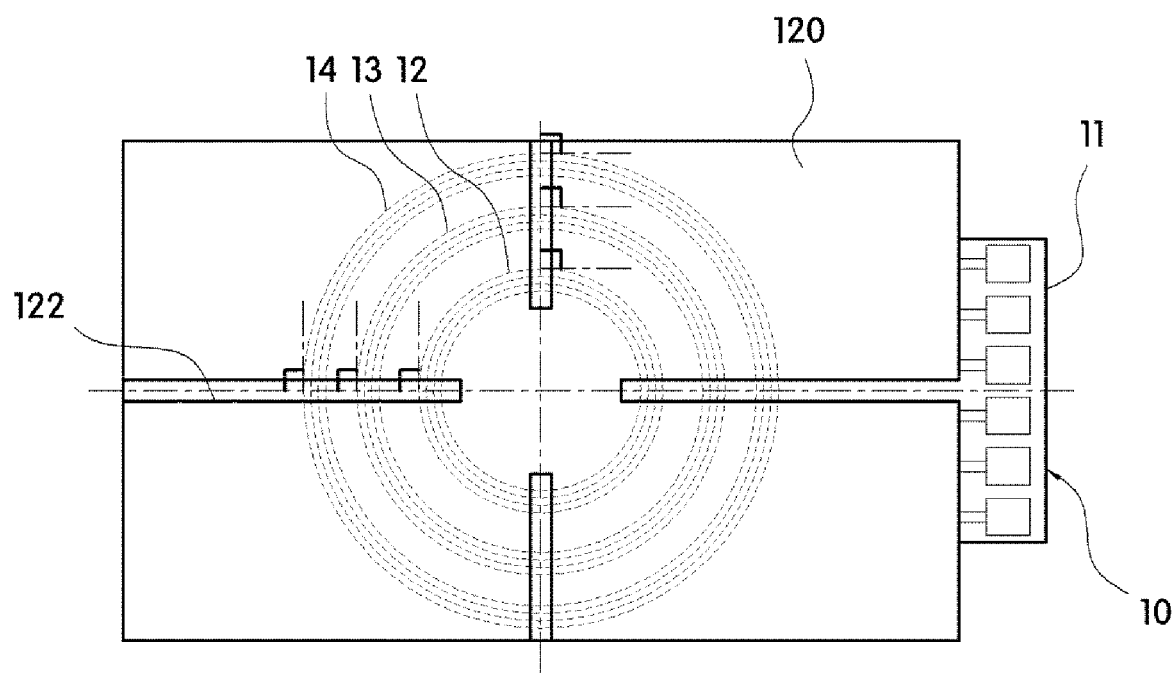
Figure 4A:
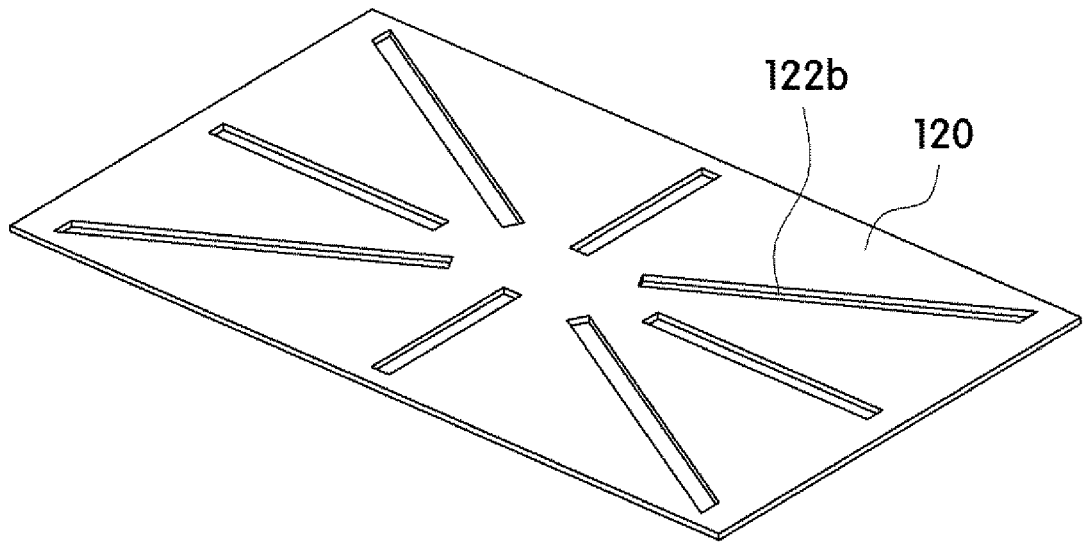
FIGS. 4A to 4D are views showing various forms of slits in the metallic protecting member, according to exemplary embodiments of the present disclosure.
Figure 4B:
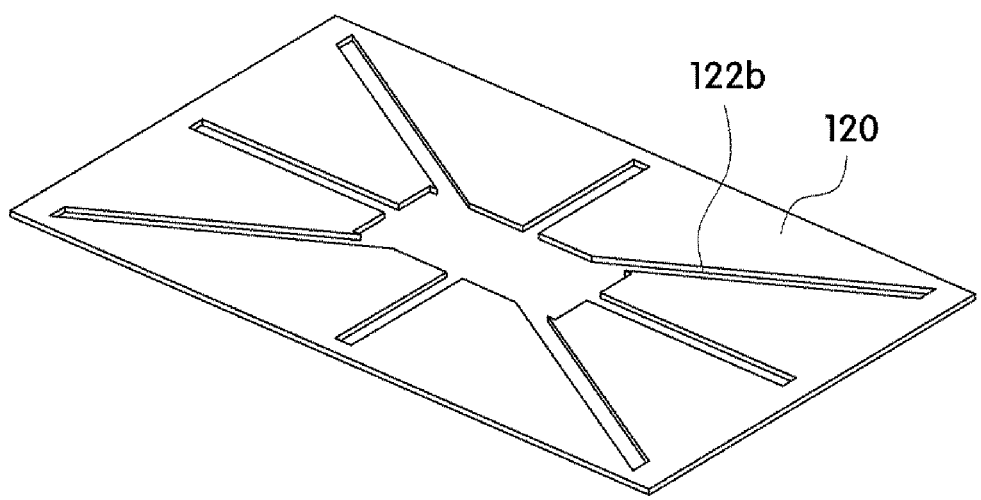
Figure 4C:
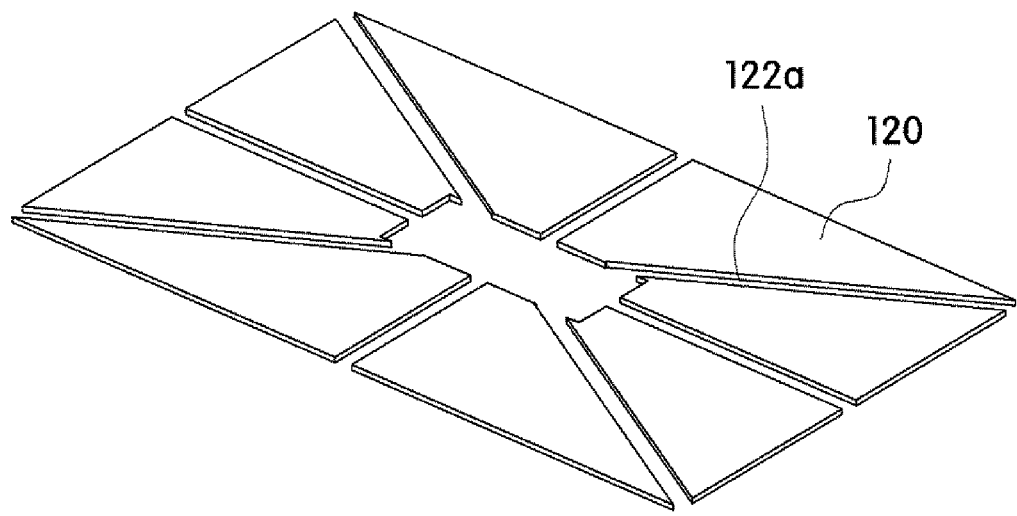
Figure 4D:
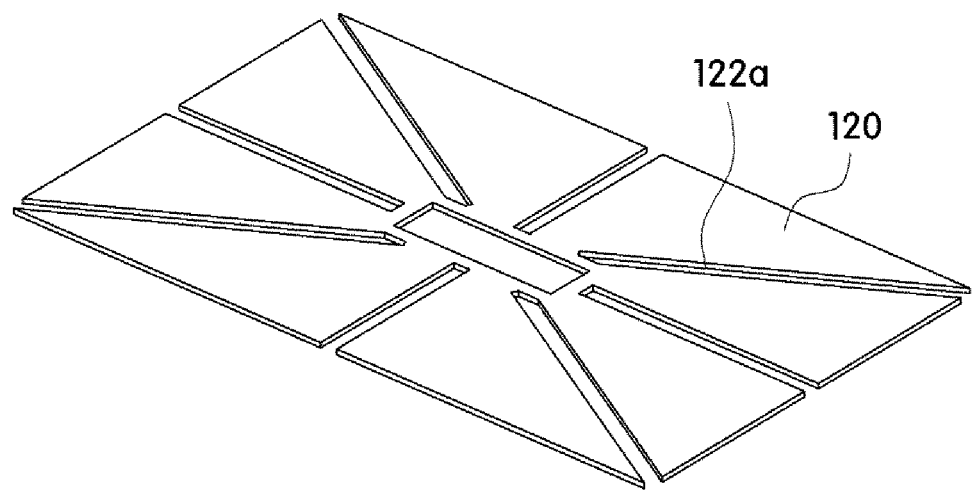
Figure 8:
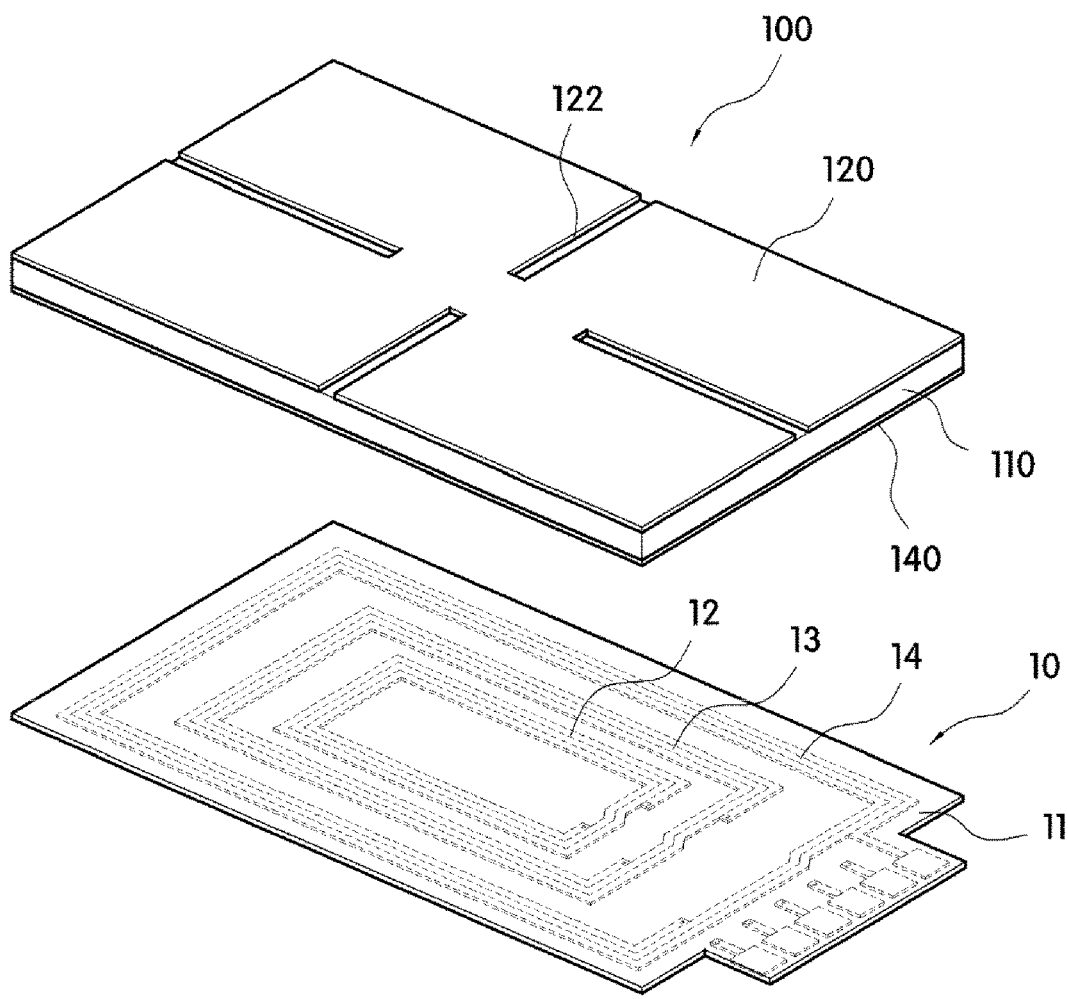
FIG. 8 is a schematic view of a wireless power transfer module to which the magnetic field shielding unit is applied, according to an exemplary embodiment of the present disclosure.

For example, the plurality of antennas 12, 13, and 14 may include at least one of a wireless power transfer antenna 12, a magnetic secure transmission (MST) 13 antenna and a near field communication (NFC) antenna 14 (refer to FIGS. 3A, 3B and 8).

Here, a plurality of the antennas 12, 13 and 14 may be formed of a flat coil wound in a clockwise direction or counterclockwise direction. The wound flat coil may have a circular shape, an elliptical shape, a spiral shape, or a polygonal shape such as a quadrangular shape. The antenna may be a loop-shaped coil pattern which can be made by patterning a conductor such as a copper foil on at least one surface of a circuit board 11 made from synthetic resin such as polyimide (PI), polyethylene terephthalate (PET), or the like, or by using conductive ink, or may be configured in a form of combination of the flat coil and the metallic pattern formed on a side of the circuit board 11.

The metallic protecting member 120 may be attached to a surface of the magnetic field shielding sheet 110 via the adhesive member 130. Preferably, the metallic protecting member 120 may be disposed on a surface of the antenna unit 10 which is the opposite the magnetic field shielding sheet 110, that is, on the surface of the magnetic field shielding sheet 110 exposed to the outside.

Here, the metallic protecting member 120 may concurrently perform a function of protecting the magnetic field shielding sheet 110 and a function of radiating heat generated from the heat source to the outside.

In other words, the metallic protecting member 120 applied to the present disclosure may concurrently perform the function as the protective sheet and the function as the heat radiating sheet.

For this purpose, the metallic protecting member 120 may be made of a metallic material having thermal conductivity. Accordingly, the metallic protecting member 120 may radiate heat transferred from the heat source to the outside, thereby securing the heat radiating performance through the metallic protecting member 120 without using the separate heat radiating member such as graphite.

Here, the metallic protecting member 120 may be formed to have a thin thickness so as not to increase the overall thickness of the magnetic field shielding unit 100, and may be formed to have a relatively thin thickness as compared with the magnetic field shielding sheet 110. Preferably, a thickness of the metallic protecting member 120 may be ⅟30 to ⅓ of the thickness of the magnetic field shielding sheet 110.

That is, the metallic protecting member 120 may have substantially same thickness as that of a conventional protective film attached to at least one surface of the magnetic field shielding sheet 110 to protect the magnetic field shielding sheet 110. The metallic protective member 120 attached to a surface of the magnetic field shielding sheet 110 may replace the conventional protecting film used for simply protecting the magnetic field shielding sheet 110.

Accordingly, unlike the conventional protective film protecting the magnetic field shielding sheet 110 from the surrounding environment, the metallic protecting member 120 can perform concurrently the function for protecting the magnetic field shielding sheet 110 and the function for radiating heat.

Here, the metallic material constituting the metallic protecting member 120 may be cooper, aluminum or an alloy based on combination thereof, which have excellent thermal conductivity, or may be an alloy including at least one of copper or aluminum. The metallic protecting member 120 may have a thickness which is $\frac{1}{30}$ to $\frac{1}{3}$ of a thickness of the magnetic field shielding sheet 110.

For example, the metallic protecting member 120 may be a metallic thin film having the thermal conductivity of 200 W/m·K or more, and the metallic thin film may have the thickness of $\frac{1}{30}$ to $\frac{1}{3}$ of the thickness of the magnetic field shielding sheet 110. For example, the metallic protecting member 120 may be a plate-shaped aluminum foil or a copper foil having a predetermined area.

The magnetic field shielding unit 100 according to the present disclosure may be constructed such that the metallic protecting member 120 is made from the metallic material having very thin thickness and is directly attached to a surface of the magnetic field shielding sheet 110 via the adhesive member 130. Accordingly, the magnetic field shielding unit 100 can further have the heat radiating function in addition to the protecting function while having the same thickness as or less than that of the conventional protective film that merely performs the protective function.

As a result, the protecting function and the heat radiating function may be performed concurrently through the metallic protecting member 120 without increasing the overall thickness of the magnetic field shielding unit 100 according to exemplary embodiments of the present disclosure. Therefore, even if the magnetic field shielding unit 100 according to present disclosure is used alone, the magnetic field shielding unit 100 can perform not only the shielding function for shielding the magnetic field but also the heat radiating function for radiating heat.

In addition, since the metallic protecting member 120 is made from the metallic material, the rigidity of the material itself is increased, so that the rigidity of the protecting member 120 can be significantly increased as compared with the conventional protective film made from material such as PET. Since the magnetic field shielding unit 100 according to the present disclosure has the metallic protecting member 120 replacing the conventional protective film which is easily damaged by an external impact or scratches, the magnetic field shielding sheet 110 can be stably protected from an external impact. Accordingly, the magnetic field shielding sheet 110 can be protected by the metallic protecting member 120, and the deformation such as cracks due to the external impact is prevented, thereby minimizing the change in characteristics.

Figure 9:
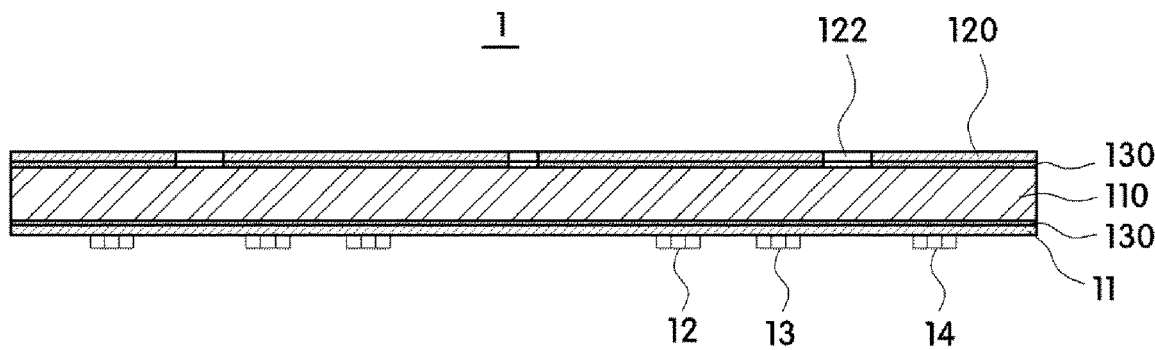
FIG. 9 is a sectional view of the wireless power transmitting module shown in FIG. 8.

For example, the magnetic field shielding unit 100 according to the present disclosure may be applied to the wireless power transfer module 1 including an antenna unit 10 and the shielding sheet 110 as shown in FIGS. 8 to 9. Particularly, when the wireless power transfer module 1 is implemented based on a wireless power receiving module under a design condition with severe limitations with respect to total thickness, the heat generated from the heat source including the antenna unit 10 can be radiated to the outside through the metallic protecting member 120. Thus, the entire thickness of the wireless power receiving module may be further reduced since there is no need to use a separate heat radiating member for radiating heat.

Here, in order to protect the magnetic field shielding sheet 110, the protective film 140 formed of a fluorine resin film including at least one of a polyethylene terephthalate (PET), polypropylene (PP), and polyterephthalate (PTFE) may be attached through the adhesive member 130 on the other surface of the magnetic field shielding sheet 110 on which the metallic protecting member 120 is not attached.

Accordingly, in case that the antenna unit 10 is attached to the surface of the magnetic field shielding unit 100 according to the present disclosure, by removing the protective film 140, the antenna unit 10 may be directly attached to a surface of the magnetic field shielding sheet 110 through the adhesive member 130 which is disposed between the protective film 140 and the magnetic field shielding sheet 110.

On the other hand, the adhesive member 130 may include the thermal conductive component to further enhance the heat radiating effect. The adhesive member 130 may be an inorganic-material-type adhesive agent in liquid or gel state including the thermal conductive component. In addition, the adhesive member 130 may be a plate-shaped substrate or the substrate-type on which at least one surface of the substrate is coated with liquid or gel type adhesive agent including the thermal conductive component.

In an exemplary embodiment of the present embodiment, the adhesive agent may include a thermosetting, a photo-curing-type, or a decompressive-adhesion-type adhesive component, depending on a selected adhesive method. The adhesive component may be any one selected from a group of acrylic, urethane, epoxy and silicone adhesive agent, and may further include a hardening agent which is commonly used for crosslinking the adhesive component. Since the hardening agent may be selected in consideration of the specific kind of the selected adhesive component and the adhesive method, the present disclosure is not particularly limited thereto.

In addition, the adhesive agent may further include the thermal conductive component for the heat radiating property, and the kind thereof is not limited as long as it has thermal conductivity. As a non-limiting example, the thermal conductive component may be metallic, inorganic, organic, or mixture material thereof.

Specifically, the thermal conductive component may include at least one material selected from the group consisting of a metal powder such as aluminum (Al), nickel (Ni), copper (Cu), tin (Sn), zinc (Zn), tungsten (W), iron (Fe), silver (Ag), gold (Au), and the like; calcium carbonate ($CaCO_3$), aluminum oxide ($Al_2O_3$), aluminum hydroxide ($Al(OH)_3$), silicon carbide (SiC); an inorganic powder such as boron nitride (BN) and aluminum nitride (AlN); and as for carbon material, an organic powder such as graphite, graphene, carbon nanotubes (CNT), carbon nanofibers (CNF) and the like. The thermal conductive component may preferably include at least one carbon material selected from the group consisting of graphite, graphene, CNT, and CNF.

In an exemplary embodiment of the present embodiment, the adhesive agent may be formed through an adhesive component, a hardening agent, a carbon-based filler as the thermal conductive component, and a heat-radiation-adhesive-layer forming component including a physical property enhancing component for enhancing the heat radiation property and the adhesion property. The carbon-based filler may be mixed in an amount of 0.1 to 60% by weight in the heat-radiation-adhesive-layer forming component. 0.01 to 20 parts by weight of the physical property enhancing component may be mixed with 100 parts by weight of the carbon-based filler. The remaining amount may be the adhesive component and the hardening agent.

Here, 5 to 300 parts by weight of the hardening agent may be mixed with 100 parts by weight of the adhesive agent, but the mixture ratio may not be limited thereto, and the mixture ratio may be changed according to the purpose.

The adhesive component may preferably be epoxy resin. As a non-limiting example, it may be at least one material selected from the group consisting of glycidyl ether type epoxy resin, glycidylamine type epoxy resin, glycidyl ester type epoxy resin, linear aliphatic type epoxy resin, cyclo aliphatic epoxy resin, heterocyclic containing epoxy resin, substituted epoxy resin, naphthalene-based epoxy resin, and derivatives thereof.

When the epoxy resin is contained as the adhesive component, the hardening agent may include at least one of a polyhydric hydroxy compound, an aliphatic amine, an aromatic amine, an acid anhydride, and a latent hardening agent. The carbon-based filler may include one selected from the group consisting of single-walled carbon nanotube, double-walled carbon nanotube, multi-walled carbon nanotube, graphene, graphene oxide, graphene nanoplate, graphite, carbon black, carbon-metal complex, and the like.

The physical property enhancing component may preferably include a silane compound, and the silane-based compound may be 3-[N-anil-N-(2-aminoethyl)] aminopropyltrimethoxysilane, 3-(N-anil-N-glycidyl) aminopropyltrimethoxysilane, 3-(N-anil-N-methacrylonyl) aminopropyltrimethoxysilane, 3-glycidyloxypropylmethylethoxysilane,N,N-Bis[3-(trimethoxycinyl)propyl]methacrylamide, γ-glycidoxytrimethyldimethoxysilane, 3-glycidyloxypropyltrimethoxysilane, 3-glycidyloxy propyltriethoxysilane, 3-glycidyloxypropylmethylmethoxysilane, beta (3,4-epoxycyclohexyl) ethyltrimethoxysil, 3-methacryloxypropyltrimethoxysilane, 3-glycidyloxypropylmethyldimethoxysilane, heptadecafluorodecyltrimethoxysilane, 3-methacryloxypropylmethyldimethoxysilane, 3-methacryloxypropyl Tris (trimethylsiloxy) silane, methyltris (dimethylsiloxy) silane, 3-aminopropyltriepoxysilane, 3-mercaptopropyltrimethoxysilane and N-(β-aminoethyl)-γ-aminopropyltrimethoxysilane, and the like.

Here, one or more kinds of additives such as a dispersant, a dispersion stabilizer, a leveling agent, a pH adjuster, an ion trapping agent, a viscosity adjuster, a thixotropic agent, an antioxidant, a heat stabilizer, a light stabilizer, an ultraviolet absorber, a coloring agent, a dehydrating agent, a flame retardant, an antistatic agent, an antifungal agent, an antiseptic agent and the like may be added to the heat-radiation-adhesive-layer forming composition. The various additives listed above can be those well known in the art and are not particularly limited in the present disclosure. Further, the heat-radiation-adhesive-layer forming component may further include a solvent, and a conventional solvent may be selected according to the selected adhesive component, so that the present disclosure is not particularly limited thereto.

Figure 5:
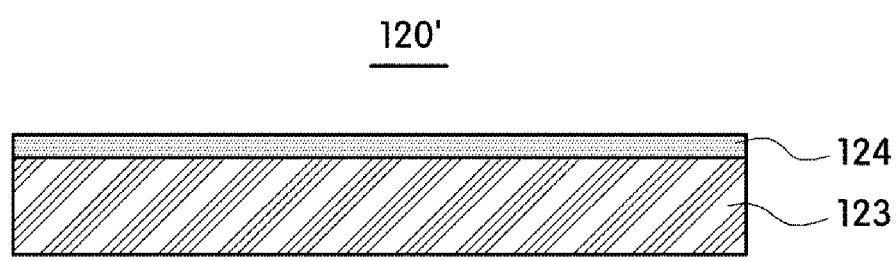
FIG. 5 is a view showing a sectional view of the metallic protecting member laminated with a coating layer, according to an exemplary embodiment of the present disclosure.

As shown in FIG. 5, the metallic protecting member 120' may include a substrate layer 123 made from the metallic material for heat radiation and a coating layer 124 coated for radiation on at least one surface of the substrate layer 123. Here, the coating layer 124 may be formed of a metallic oxide material including ceramic or carbon black having a nano-sized particle.

The coating layer 124 may increase the radiation rate to further enhance the heat radiating effect of the metallic protecting member 120'.

In addition, the metallic protecting member 120 may form an oxide film by oxidizing the surface of the metallic material constituting the metallic protecting member 120 through the blackening treatment. For example, in case that the metallic material is copper, the oxide film may be a material such as $CuO$ or $Cu_2O$.

By this process, it is possible for the oxide film to minimize a cracking by preventing corrosion and to improve the adhesion according to the increasing of the surface area and increase radiation performance of the material itself, thereby enhancing the heat radiating property without increasing the overall thickness.

In addition, the oxide film formed on the surface of the metallic layer may act as an insulating layer, thereby increasing the overall resistance value, which can result in reducing the occurrence of eddy current. Here, the blackening treatment may be performed using chemicals, heat treatment, or plasma treatment.

According to an exemplary embodiment of the present disclosure, as shown in FIGS. 1 and 2, the metallic protecting member 120 may be formed with at least one slit 122 having a predetermined length to increase the self-resistance of the metallic protecting member 120, thereby suppressing the generation of eddy current.

Particularly, if the magnetic field shielding unit 100 is applied to a wireless power transfer module 1 including at least one wireless power transfer antenna 12, it is possible to increase the wireless charging efficiency by suppressing generation of the eddy current by means of the slit 122 formed in the metallic protecting member 120.

Here, the slit 122 may be provided overall or partially in the whole area of metallic protecting member 120. When a plurality of slits 122 are provided in the metallic protecting member 120, the plurality of slits 122 are disposed in a predetermined pattern, or in a random pattern.

In other words, the slit 122 may be formed in various forms because it can suppress the generation of eddy current even if at least one of the slits 122 is formed at an arbitrary position of the metallic protecting member 120. The slit 122 may be concentrically formed in a local area of the whole area of the metallic protecting member 120.

For example, the slit 122 may be formed in various forms as shown in FIGS. 4A to 4D. Specifically, each of the slits 122 may be formed in a form of an incision portion 122a with a predetermined length which radically extends to near the edge from the central part of the metallic protecting member 120 and passes through the metallic protecting member 120 (refer to FIGS. 4A and 4B). Each of the slits 122 may be formed in a form of an incision portion 122a which radically extends out to the edge from the central part of the metallic protecting member 120 and passes through the metallic protecting member 120 (refer to FIGS. 4C and 4D). The slit may be in the form of a through-hole 122b with a predetermined length formed on the inner part of the metallic protecting member 120 (refer to FIGS. 4B to 4D). In addition, the incision portion 122a and the through-hole 122b may be provided in a combined form (refer to FIGS. 4B to 4D). The incision portion 122a and the through-hole 122b may be connected to each other, or may not be connected to each other. Although the slit 122 is illustrated as passing through the metallic protecting member 120 in FIGS. 4A to 4D, the present disclosure is not limited thereto. The slit 122 may be provided as a receiving portion inserted with predetermined depth in a surface of the metallic protecting member 120.

Here, the slit 122 may be formed so as to avoid a specific position. In an exemplary example, it may be formed by avoiding an area corresponding to a heat generating component such as an application processor (AP) which generates a lot of heat during operation. In other words, since the slit 122 is not formed directly above or below the heat generating component, a hindrance of the radiating of heat transmitted from the heat generating component can be obviated, in the result, it becomes possible to minimize or prevent deterioration of the heat radiating performance.

The slit 122 may be formed in an area corresponding to the wireless power transfer antenna 12 when the antenna unit 10 disposed on one side of the magnetic field shielding unit 100 includes the wireless power transfer antenna 12. The slit 122 may be formed in a direction perpendicular to the pattern constituting the wireless power transfer antenna 12.

As shown FIG. 3A, in case that the wireless power transfer antenna 12 is formed in a rectangular pattern, the slit 122 may be provided so as to have a predetermined length in a direction perpendicular to the longitudinal direction of the pattern constituting the wireless power transfer antenna 12.

As shown in FIG. 3B, in case that the wireless power transfer antenna 12 is formed in a circular pattern, the slit 122 is may be provided so as to have a predetermined length in direction perpendicular to a tangent line of the pattern constituting the wireless power transfer antenna 12.

In addition, when the wireless power transfer antenna 12 is provided in a form having both a straight line section and a curved line section, the slit formed in the straight line section may be provided to have a predetermined length in a direction perpendicular to the longitudinal direction of the pattern constituting the wireless power transfer antenna 12, as shown in FIG. 3A. And, the slit formed in the curved line section may be provided to have a predetermined length in a direction perpendicular to the tangent line of the pattern constituting the wireless power transfer antenna 12, as shown in FIG. 3B.

Meanwhile, when the antenna unit 10 includes a plurality of antennas 12, 13, and 14 having different roles, the magnetic field shield sheet according to present disclosure may be provided with a plurality of sheets 211 and 212 having different characteristics so as to enhance the performance of the corresponding antennas 12, 13, and 14 respectively.

For example, when the antenna unit 10 includes a wireless power transfer antenna 12 and an NFC antenna 14 operating in different frequency bands, the magnetic field shielding sheets 210, 210', or 210" for these antennas may include a first shielding sheet 211 and a second shielding sheet 212 having different characteristics so as to improve the performance of the corresponding antenna in the frequency band. Here, the antenna unit 10 may further include a MST antenna 13.

More specifically, the first shielding sheet 211 may be disposed in an area corresponding to the wireless power transfer antenna 12 to enhance the performance of the wireless power transfer antenna 12. The second shielding sheet 212 may be disposed on an area corresponding to the NFC antenna 14 to enhance the performance of the NFC antenna 14.

Here, the first shielding sheet 211 may have an area which can fully cover the wireless power transfer antenna 12, and the second shielding sheet 212 may have an area which can fully cover the NFC antenna 14. In addition, when the MST antenna 13 is disposed outside the wireless power transfer antenna 12, the first shielding sheet 211 may include, or not include right above area of the MST antenna 13.

Figure 7A:
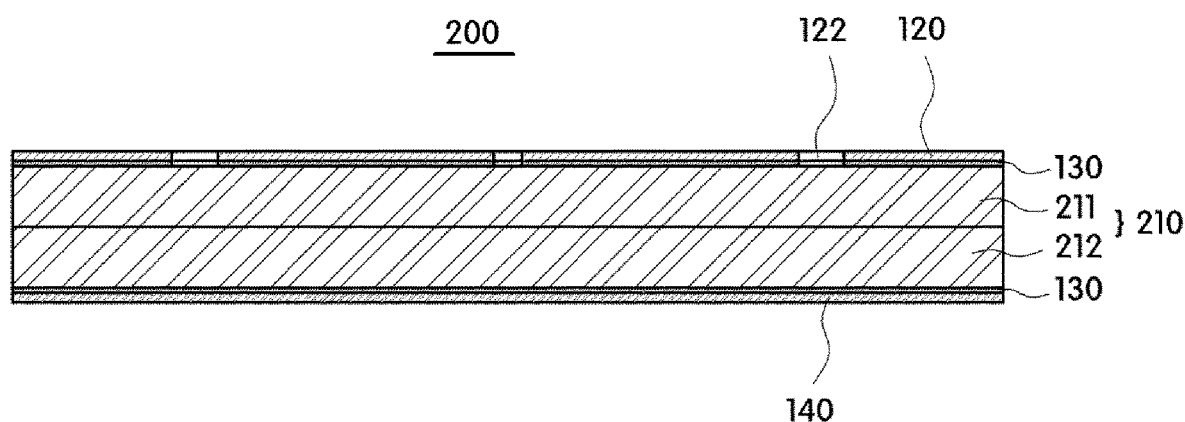
FIG. 7A to 7C are views showing various disposition relationship between a first shielding sheet and a second shielding sheet in case that the shielding sheet includes the first shielding sheet and the second shielding sheet, according to exemplary embodiments of the present disclosure.
Figure 7B:
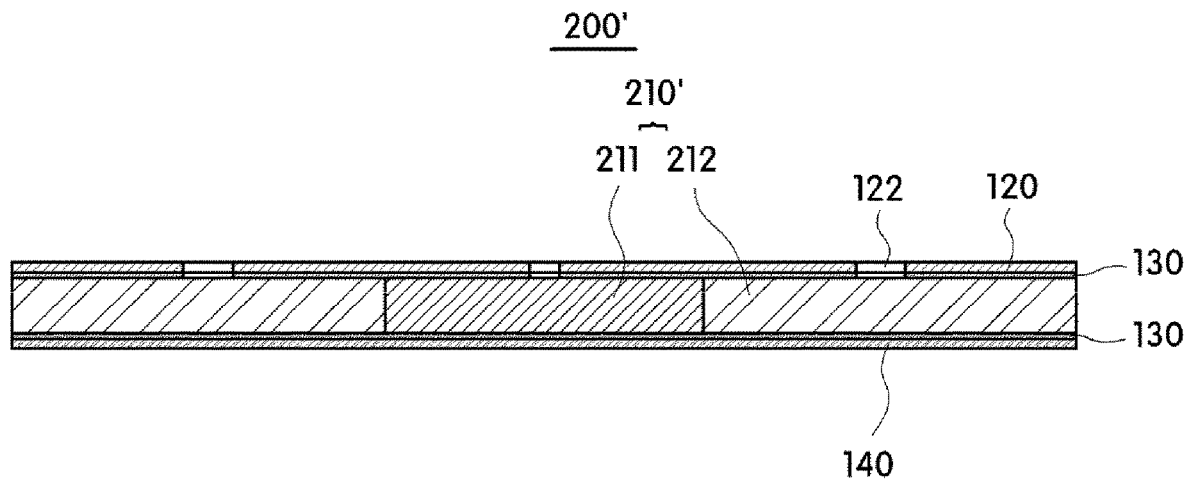
Figure 7C:
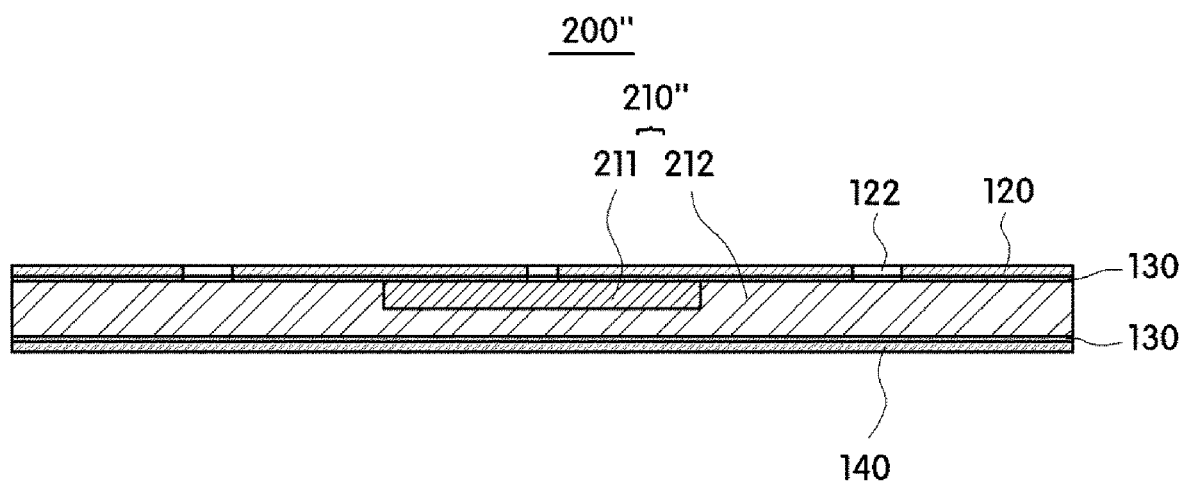

In this case, magnetic field shielding unit 210 may be provided in a form that the first shielding sheet 211 is stacked on a side of the second shielding sheet 212 (refer to FIG. 7A). Moreover, in order to reduce the overall thickness of the magnetic field shielding sheets 210' and 210", the first shielding sheet 211 having the same thickness as the second shielding sheet 212 may be inserted into the second shielding sheet 212 (See FIG. 7B). The first shielding sheet 211 having a thinner thickness than the second shielding sheet 212 may be inserted into one surface of the second shielding sheet 212 (refer to FIG. 7C).

In other words, the first shielding sheet 211 and the second shielding sheet 212 may have different permeabilities in a predetermined frequency band, or may have different saturation magnetic fields. If the first shielding sheet 211 and the second shielding sheet 212 have the same permeability, these two shielding sheets 211 and 212 may have different values of permeability loss rate.

More specifically, the first shielding sheet 211 may have a relatively higher permeability than that of the second shielding sheet 212 in a low frequency band of 350 kHz or less, and may have a relatively higher saturation magnetic field than that of the second shielding sheet 212 in the frequency band of 350 kHz or less. In a case that the first shielding sheet 211 and the second shielding sheet 212 have the same permeability in the frequency band of 350 kHz or less, the permeability loss rate of the first sheet 211 may be lower than that of the second shielding sheet 212.

In an exemplary example, a ribbon sheet including at least one of an amorphous alloy and a nanocrystalline alloy may be used as the first shielding sheet 211. A ferrite sheet may be used as the second shielding sheet 212.

Accordingly, since the ribbon sheet including at least one of an amorphous alloy and a nanocrystalline alloy has a relatively higher magnetic permeability than that of the ferrite sheet in the low frequency band of 350 kHz or less, a time-varying magnetic field generated through the wireless power transmission in the frequency band of 100 to 300 kHz by a wireless power transmitting module during wireless charging can be attracted by the first shielding sheet 211 having a relatively higher permeability. Thus, the wireless power transfer antenna 12 disposed on the first shielding sheet 211 can receive the wireless power signal with high efficiency.

Meanwhile, when the magnetic field shielding sheet 210, 210', or 210" is used for the wireless power receiving module and the wireless power transmitting module is provided with a permanent magnet, the magnetic field shielding sheet 210, 210' or 210" may be required to shield a time-invariant magnetic field generated by the permanent magnet provided in wireless power transmitting module. However, since the time-invariant magnetic field has a greater influence on the shielding sheet 210, 210' or 210" than the time-varying magnetic field generated by the antenna unit 10, the time-invariant magnetic field may cause the shielding sheet to be magnetically saturated, thereby drastically lowering the performance of the shielding sheet, or the power transmission efficiency.

Therefore, when the wireless power transmitting module employs the permanent magnet it is necessary to prevent magnetic saturation by the permanent magnet of the wireless power transmitting module. Since the ribbon sheet including at least one of the amorphous alloy and the nanocrystal alloy has a relatively larger saturation magnetic field than the ferrite sheet in the frequency band of 100 to 300 kHz, the first shielding sheet 211 disposed in an area corresponding to the wireless power transfer antenna 12 can prevent magnetization by the permanent magnet in the wireless charging frequency band of 100 to 300 kHz, and thus smooth wireless charging can be achieved.

Accordingly, the time-varying magnetic field generated through the power transmission in the frequency band of 100 to 350 kHz by the wireless power transmitting module is induced toward the first shielding sheet 211 having a relatively higher permeability. Thus, the wireless power transfer antenna 12 disposed in an area corresponding to the first shielding sheet 211 can receive the wireless power signal with high efficiency.

Meanwhile, the second shielding sheet 212 may have a relatively higher magnetic permeability at a high frequency of 13.56 MHz than that of the first shielding sheet 211. In a case that the first shielding sheet 211 and the second shielding sheet 212 have the same permeability at the frequency of 13.56 MHz, the permeability loss rate of the second shielding sheet 212 may be relatively smaller than the permeability loss rate of the first shielding sheet 211.

In an exemplary example, the ribbon sheet including at least one of an amorphous alloy and a nanocrystalline alloy may be used as the first shielding sheet 211, and the ferrite sheet may be used as the second shielding sheet 212.

The ferrite sheet has a relatively higher magnetic permeability than that of the ribbon sheet including at least one of an amorphous alloy and a nanocrystalline alloy at the frequency of 13.56 MHz. Thus, in case that NFC is performed, a time-varying magnetic field generated by the high frequency signal of 13.56 MHz generated from an antenna equipped in a radio frequency (RF) reader device may be induced toward the second shielding sheet 212 having a relatively high permeability. Thereby, the NFC antenna 14 disposed on an area corresponding to the second shielding sheet 212 can receive the high frequency signal with high efficiency.

In addition, when the permeability loss rate of the second shielding sheet 212 is lower than that of the first shielding sheet 211, even if the first shielding sheet 211 and the second shielding sheet 212 have the same permeability in the frequency of 13.56 MHz, as a result the loss of permeability according to the permeability loss rate may be reduced when the NFC is performed. Accordingly, the time-varying magnetic field generated by a high frequency signal of 13.56 MHz generated from the antenna equipped in the RF reader device is induced toward the second shielding sheet 212 having a relatively high permeability, so that the NFC antenna 14 disposed over the second shielding sheet 212 can receive the high frequency signal with high efficiency.

Here, it has been described above that the ribbon sheet including at least one of an amorphous alloy and a nanocrystal alloy may be used as the first shielding sheet 211, and the ferrite sheet may be used as the second shielding sheet 212. However, the present disclosure is not limited thereto. The material of the first shielding sheet 211 and the second shielding sheet 212 may be variously changed to other material, as long as the permeability, the saturation magnetic field, and the permeability loss rate of the first and second shielding sheets 211 and 212 satisfy the conditions relative to each other in the corresponding frequency band.

In an exemplary embodiment, the first shielding sheet 211 and the second shielding sheet 212 may be made of the same material having different magnetic permeabilities at the frequency of 350 kHz or less and/or at the frequency of 13.56 MHz. The ferrite sheet may be used as the first shielding sheet 211, and the ribbon sheet including at least one of the amorphous alloy and the nanocrystal alloy may be used as the second shielding sheet 212. This is, because even if they are made of the same material, they can be manufactured to have different characteristics (e.g., in permeability, saturation magnetic field, permeability loss rate, etc.) through change of several conditions such as a heat treatment temperature, number of stacking layers, etc.

In addition, when the ribbon sheet including at least one of the amorphous alloy and the nanocrystal alloy is used as at least one of the first shieling sheet 211 and the second shielding sheet 212, a single-layer ribbon sheet may be used, or a multi-layered ribbon sheet formed by stacking a plurality of ribbon sheets may be used for the first shielding sheet 211 and the second shielding sheet 212 as shown in FIG. 6.

It should be noted that the magnetic field shielding units 100, 200, 200' and 200" according to the exemplary embodiments of the present disclosure can be applied to not only the Qi standard based wireless charging method but also the power matters alliance (PMA) based wireless charging method in which a part of the magnetic force lines generated in the permanent magnet may be induced through an attractor (not shown). In addition, it is noted that the magnetic field shielding units 100, 200, 200' and 200" according to the embodiment of the present disclosure can be also applied to a magnetic resonance method in which wireless charging is performed using a frequency of 6.78 MHz.

For example, the magnetic field shielding unit 100 according to an embodiment of the present disclosure may include the wireless power transfer module 1 including the shielding unit 100 and the antenna unit 10 as shown in FIGS. 8 and 9.

Here, the wireless power transfer module 1 may be used for a wireless power transmitting device for transmitting the wireless power signal to the electronic device, or may be a wireless power receiving device for receiving a wireless power signal transmitted from the wireless power transmitting device.

In addition, the antenna unit 10 applied to the wireless power transfer module 1 may use another frequency band to perform another function using other frequency band, in addition to the wireless power transfer antenna 12. For example, the other antenna may be the MST antenna 13 or the NFC antenna 14, or any other may be the wireless power transfer antenna using a different frequency band from the wireless power transfer antenna 12.

Meanwhile, unlike the above-described embodiment, the shielding sheet may include slits formed itself to reduce a loss due to an eddy current and to increase a transmission efficiency of an antenna by increasing a value of quality factor Q in the present disclosure.

Figure 10:
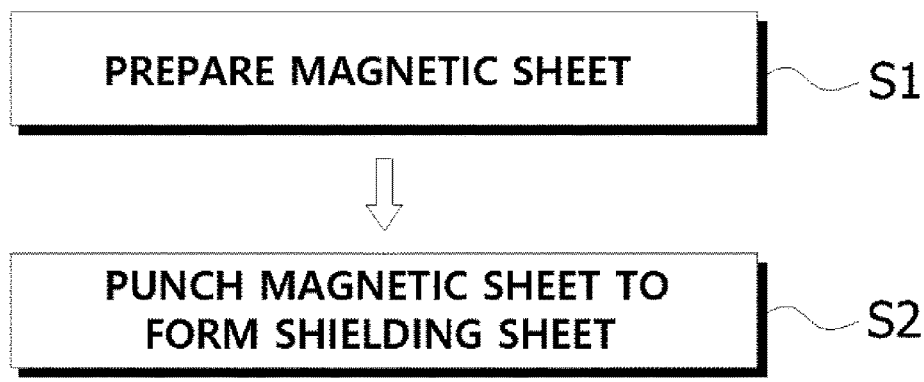
FIG. 10 is a flowchart showing a method of manufacturing a magnetic field shielding sheet according to an exemplary embodiment of the present disclosure.

To this end, a method of manufacturing a magnetic field shielding sheet according to an exemplary embodiment of the present disclosure includes preparing a magnetic sheet A having a predetermined area (S1) and punching the magnetic sheet A to form a shielding sheet 300 having a predetermined size to produce a product (S2), as illustrated in FIG. 10.

The preparing the magnetic sheet A may be a preprocess of producing the shielding sheet 300, which is an end product, by cutting the magnetic sheet A such that the shielding sheet 300 has the predetermined size suitable for a use.

That is, the magnetic sheet A may have a predetermined area such that the magnetic sheet A can be divided into a plurality of shielding sheets 300 having suitable sizes for the use.

The magnetic sheet A may be formed of a magnetic material such that the shielding sheet 300 punched from the magnetic sheet A may shield a magnetic field generated by various antennas and condense the magnetic field in a desired direction.

Here, the antenna may include any one among a wireless power transmission (WPT) antenna for wireless charging, an MST antenna for magnetic payment, and an NFC antenna for NFC, or may include a combo antenna which combines two or more thereof.

The magnetic sheet A may be provided with a plate-shaped sheet having a predetermined area. For example, the magnetic sheet A may be a plate-shaped sheet having a first area.

In this case, the magnetic sheet A may include an adhesive layer 322 formed on at least one surface of an upper surface and a lower surface thereof, and the adhesive layer 322 may be a substrate of which one or both surfaces are coated with an adhesive agent.

Accordingly, even when the shielding sheet 300 separated from the magnetic sheet A is formed as a plurality of divided pieces P in a punching process, which will be described below, the pieces P are not peeled therefrom and a separated state may be maintained due to the adhesive layer 322. Accordingly, the shielding sheet 300 may maintain a shape of the plate-shaped sheet.

In addition, a part or the whole of the adhesive agent included in the adhesive layer 322 may fill gaps between the pieces P and insulate the neighboring pieces P from each other. In this case, the adhesive agent may include a nonconductive component to insulate the neighboring pieces P from each other.

Here, the adhesive layer 322 formed on at least any one surface of the upper surface and the lower surface of the magnetic sheet A may be a substrate, including polyethylene terephthalate (PET) or polyimide (PI), of which both surfaces are coated with an adhesive agent. In this case, a release film 320 capable of being removed may be attached to an exposed surface of the adhesive layer 322 as shown in FIG. 12.

Accordingly, while the shielding sheet 300 which is an end product is used, since the adhesive agent may be externally exposed after removing the release film 320 from the shielding sheet 300, another component may be attached to the shielding sheet 300, or the shielding sheet 300 may be attached to another component.

Figure 12:
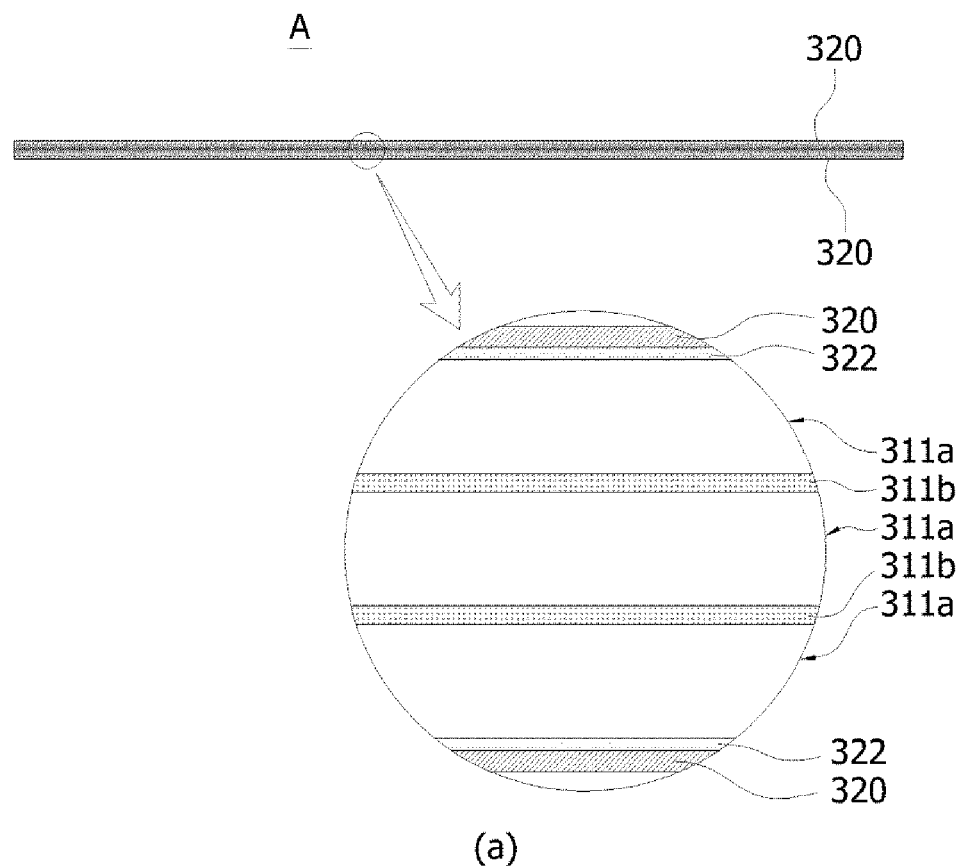
Figure 12:
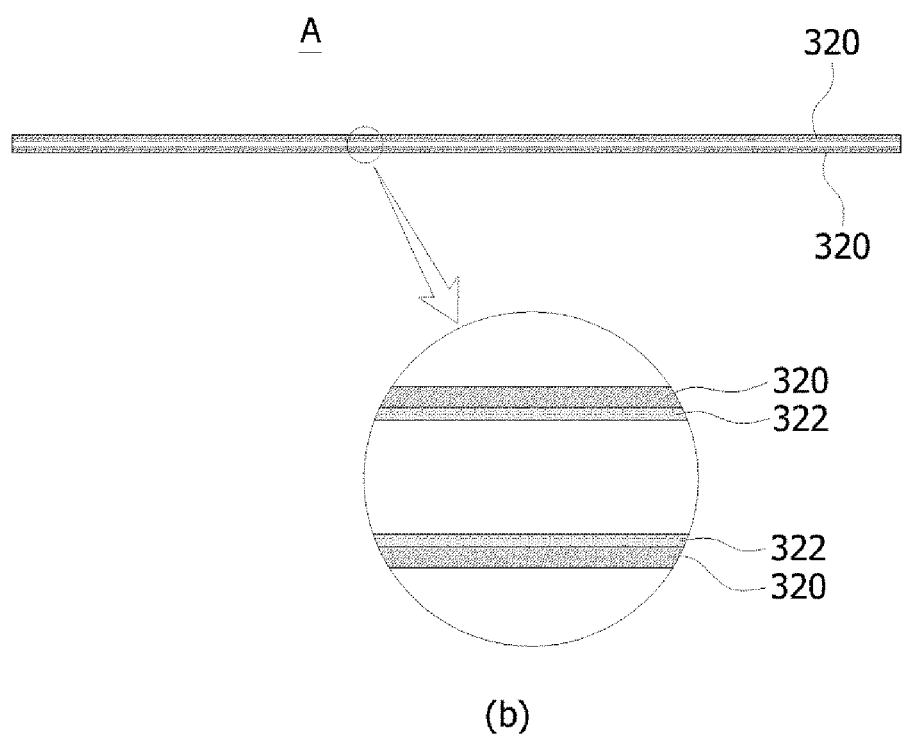

As a non-limiting example, as shown in FIG. 12, a pair of release films 320 may be attached to the upper surface and the lower surface of the magnetic sheet A with adhesive layers 322 interposed therebetween. In this case, the adhesive layer 322 may be a substrate of which both surfaces are coated with an adhesive agent.

Alternatively, the release film 320 may only be attached to any one surface of the upper surface and the lower surface of the magnetic sheet A with the adhesive layer 322 interposed therebetween. In this case, the adhesive layer 322 may be a substrate of which both surfaces are coated with an adhesive agent. Here, an adhesive layer may also not be formed at the other surface to which a release film 320 is not attached, or an adhesive layer in which only one surface of a substrate is coated with an adhesive agent may be formed on the other surface.

However, the adhesive layer 322 is not limited thereto. In addition, the adhesive layer 322 may be a liquid or gel type adhesive agent.

Meanwhile, the magnetic sheet A may be a ribbon sheet including at least one of an amorphous alloy and a nanocrystal alloy.

For example, the magnetic sheet A may be a multi-layered ribbon sheet 310 in which a plurality of ribbon sheets 311a, including at least one of an amorphous alloy and a nanocrystal alloy, are stacked into multi layers with adhesive layers 311b interposed therebetween, as shown in FIG. 12A. Here, the adhesive layer 311b may include a nonconductive component.

Figure 14:
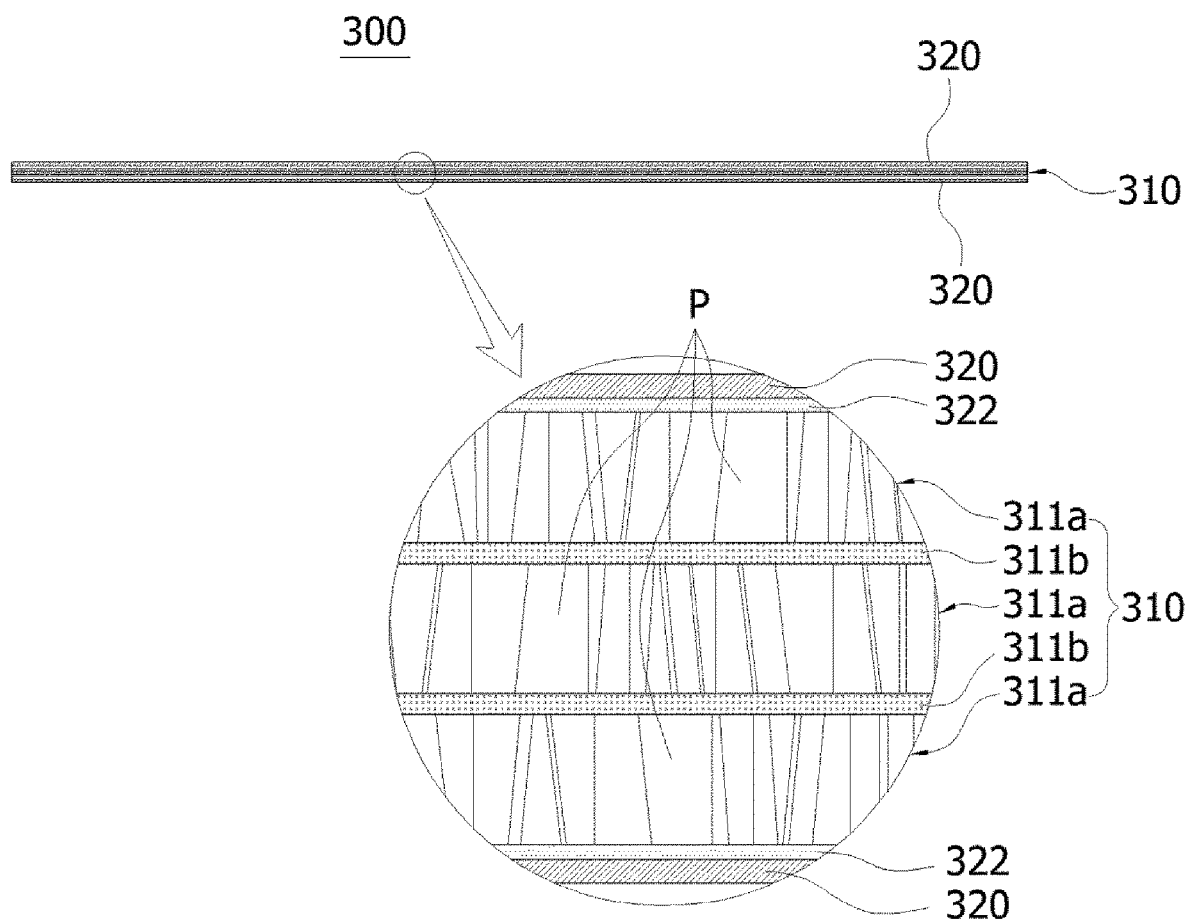
FIG. 14 is a sectional view of the magnetic field shielding sheet formed of the multi-layered ribbon sheet, which is formed through the method of manufacturing a magnetic field shielding sheet according to the exemplary embodiment of the present disclosure.

Accordingly, the shielding sheet 300 separated from the magnetic sheet A through the punching process, which will be described below, may be formed of the multi-layered ribbon sheet 310 in which the plurality of ribbon sheets 311a are stacked into the multi layers with the adhesive layers 311b interposed therebetween, as shown in FIG. 14.

In this case, the adhesive layer 311b may move to two ribbon sheets 311a forming the shielding sheet 300, and a part or the whole of the adhesive layer 311b may fill between the neighboring pieces P to insulate the neighboring pieces P from each other. In addition, in the case in which the magnetic sheet A is formed of the multi-layered ribbon sheet 310, the above-described adhesive layer 322 and release film 320 may also be omitted.

Alternatively, the magnetic sheet A may be a single-layered ribbon sheet 311a including at least one of an amorphous alloy and a nanocrystal alloy, as shown in FIG. 12B.

Figure 17:
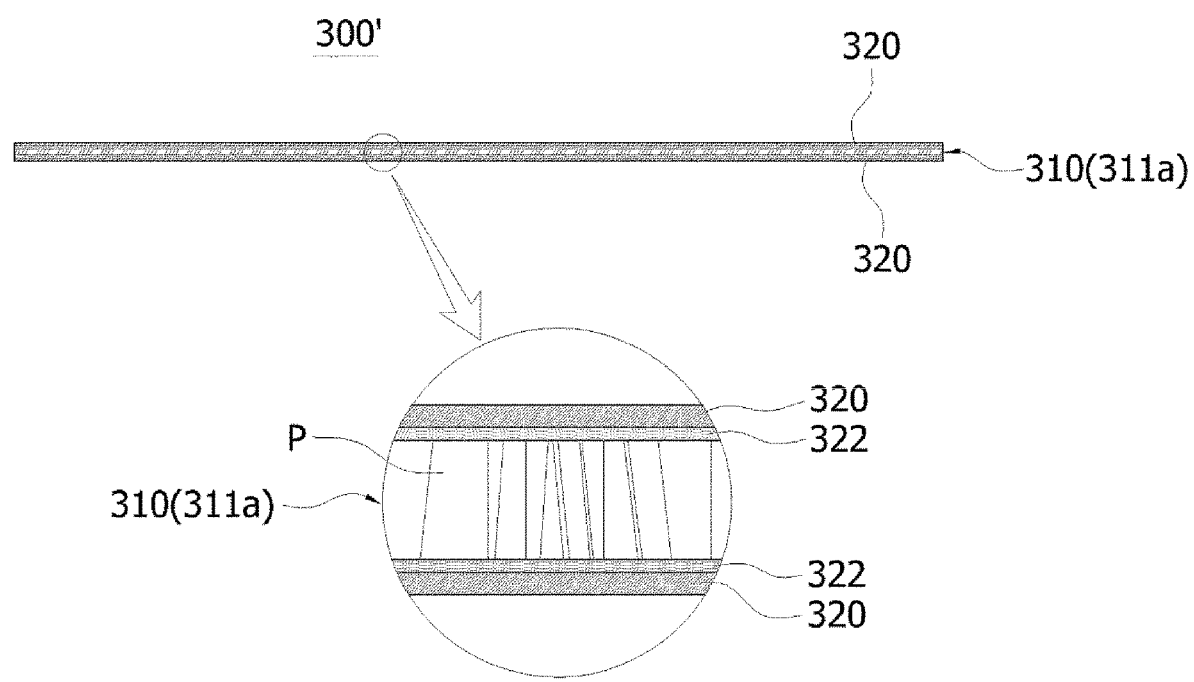
FIG. 17 is a sectional view of the magnetic field shielding sheet formed of the single-layered ribbon sheet, which is manufactured through the method of manufacturing a magnetic field shielding sheet according to an exemplary embodiment of the present disclosure.

Accordingly, a shielding sheet 300' separated from the magnetic sheet A through the punching process, which will be described below, may be formed of a single-layered ribbon sheet 311a as shown in FIG. 17.

In this case, the adhesive layer 322 and release film 320 may be sequentially provided on at least any one surface of an upper surface and a lower surface of the magnetic sheet A.

However, the material of the magnetic sheet A is not limited thereto, and it is noted that any material can be used for the magnetic sheet A as long as it has magnetic properties. That is, the magnetic sheet A may also be a magnetic sheet formed by sintering ferrite or a magnetic sheet formed by mixing soft magnetic powder and a binder. In addition, a composite sheet formed by mixing soft magnetic powder and a resin for a binder may be used for the magnetic sheet A, and Ni and Fe elements may be mixed in a predetermined ratio or Fe and Co elements may be mixed in a predetermined ratio to be used for the magnetic sheet A.

Meanwhile, the punching the magnetic sheet A to form the shielding sheet 300 (S2) may separate the shielding sheet 300 having a second area from the magnetic sheet A having a first area using a mold 20.

Here, the second area may be narrower than the first area.

Accordingly, the method of manufacturing a magnetic field shielding sheet according to the exemplary embodiment of the present disclosure may produce the plurality of shielding sheets 300 from the magnetic sheet A through the punching process.

Here, in the method of manufacturing a magnetic field shielding sheet according to the exemplary embodiment of the present disclosure, each of the shielding sheets 300 may be divided into the plurality of pieces while being separated from the magnetic sheet A through the punching process.

That is, in the punching the magnetic sheet A to form the shielding sheet 300 (S2), an edge of the shielding sheet 300 and at least one linear slit 331 in an inner region of the second area defined by the edge may be formed by the mold 20 at the same time.

Figure 11:
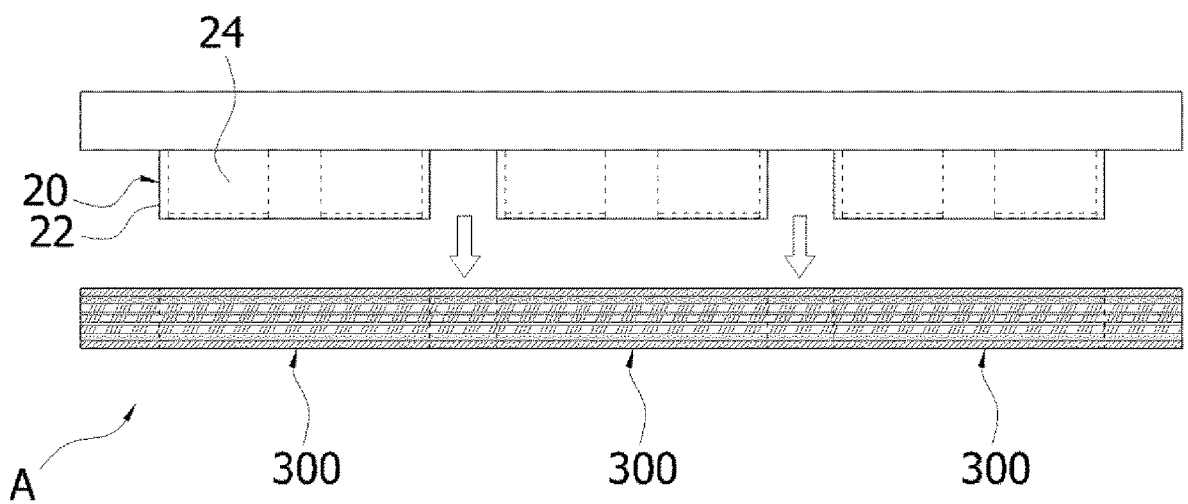
FIG. 11 is a schematic view showing a punching process of the method of manufacturing a magnetic field shielding sheet according to the exemplary embodiment of the present disclosure.

To this end, the mold 20 may include an edge blade 22 having a ring shape in order to form the edge of the shielding sheet 300 and at least one linear blade 24 disposed inside the edge blade 22, as shown in FIG. 11, in order to form the linear slit 331.

Accordingly, when the magnetic sheet A is pressed by the mold 20, the edge of the shielding sheet 300 is separated from the magnetic sheet A by the edge blade 22, and the linear slit 331 having a shape which is the same as that of the linear blade 24 may be formed by the linear blade 24 to pass through the shielding sheet 300.

Here, a protruding length of at least one linear blade 24 for forming the linear slit 331 may be less than or equal to that of the edge blade 22 for forming the edge of the shielding sheet.

In addition, the linear slit 331 may be formed to pass through a whole thickness of the magnetic sheet A or to pass through a part of the whole thickness of the magnetic sheet A.

Accordingly, the shielding sheet 300 separated from the magnetic sheet A may include the linear slit 331 formed therein in a thickness or height direction. In addition, linear slits 331 may be formed at positions corresponding to linear blades 24, and the linear slits 331 may be locally formed by the linear blades 24 at the positions inside the shielding sheet 300 except for the edge of the shielding sheet 300.

Accordingly, the shielding sheet 300 may come into direct contact with the edge blade 22 and the linear blade 24 of the mold 20 to form cracks 332 caused by at least any one of the linear slit 331 and the edge of the shielding sheet due to pressures applied by the edge blade 22 and the linear blade 24 in the punching process, and the linear slit 331 and the generated cracks 332 may be connected from each other.

Figure 13:
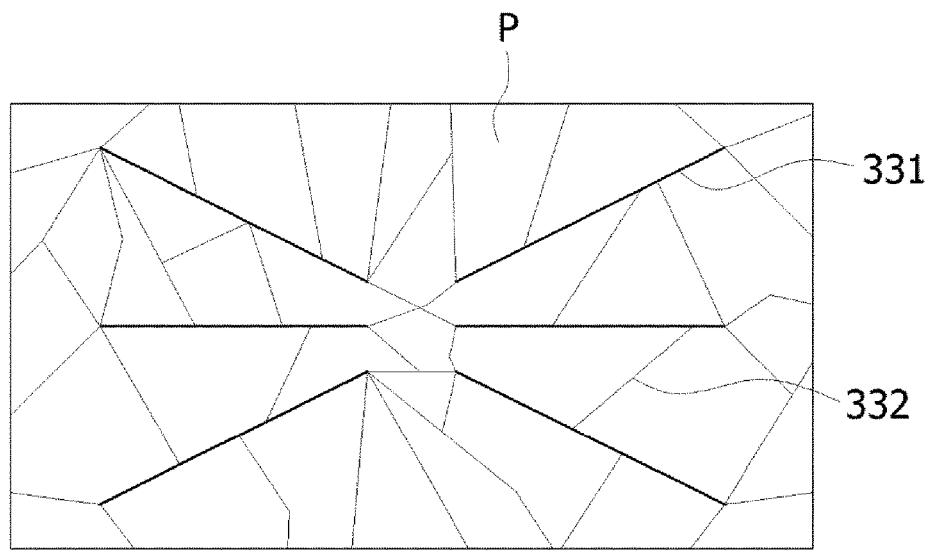
FIG. 13 is a conceptual view of linear slits in a magnetic field shielding sheet manufactured through the method of manufacturing a magnetic field shielding sheet according to the exemplary embodiment of the present disclosure and cracks caused by to the linear slits.
Figure 15:
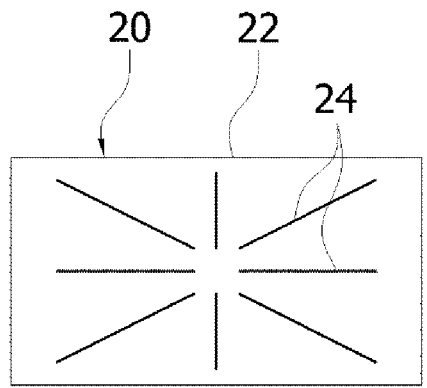
FIG. 15 is a plan view of molds having various linear blade shapes, which may be used in the method of manufacturing a magnetic field shielding sheet according to the exemplary embodiment of the present disclosure.
Figure 15:
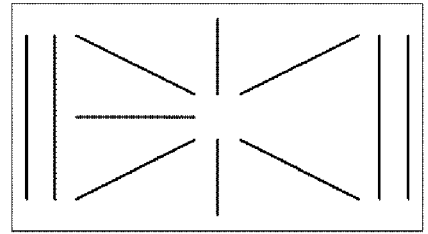
Figure 15:
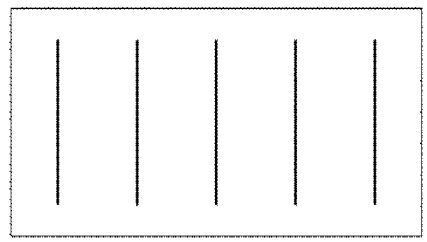
Figure 15:
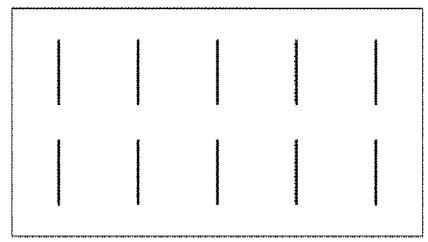
Figure 15:
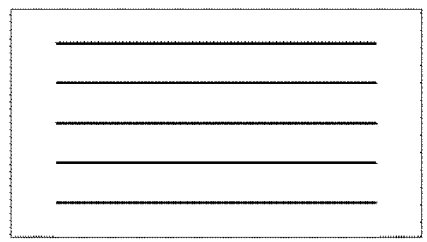
Figure 15:
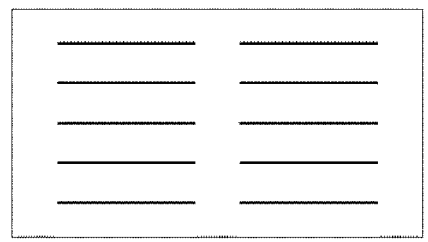
Figure 15:
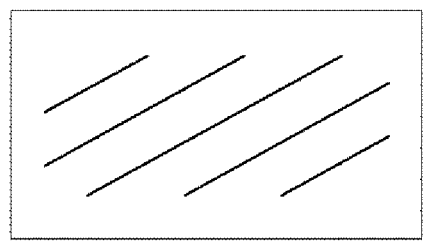
Figure 15:
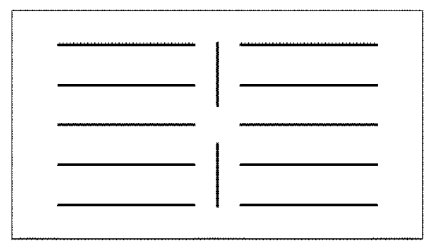
Figure 16:
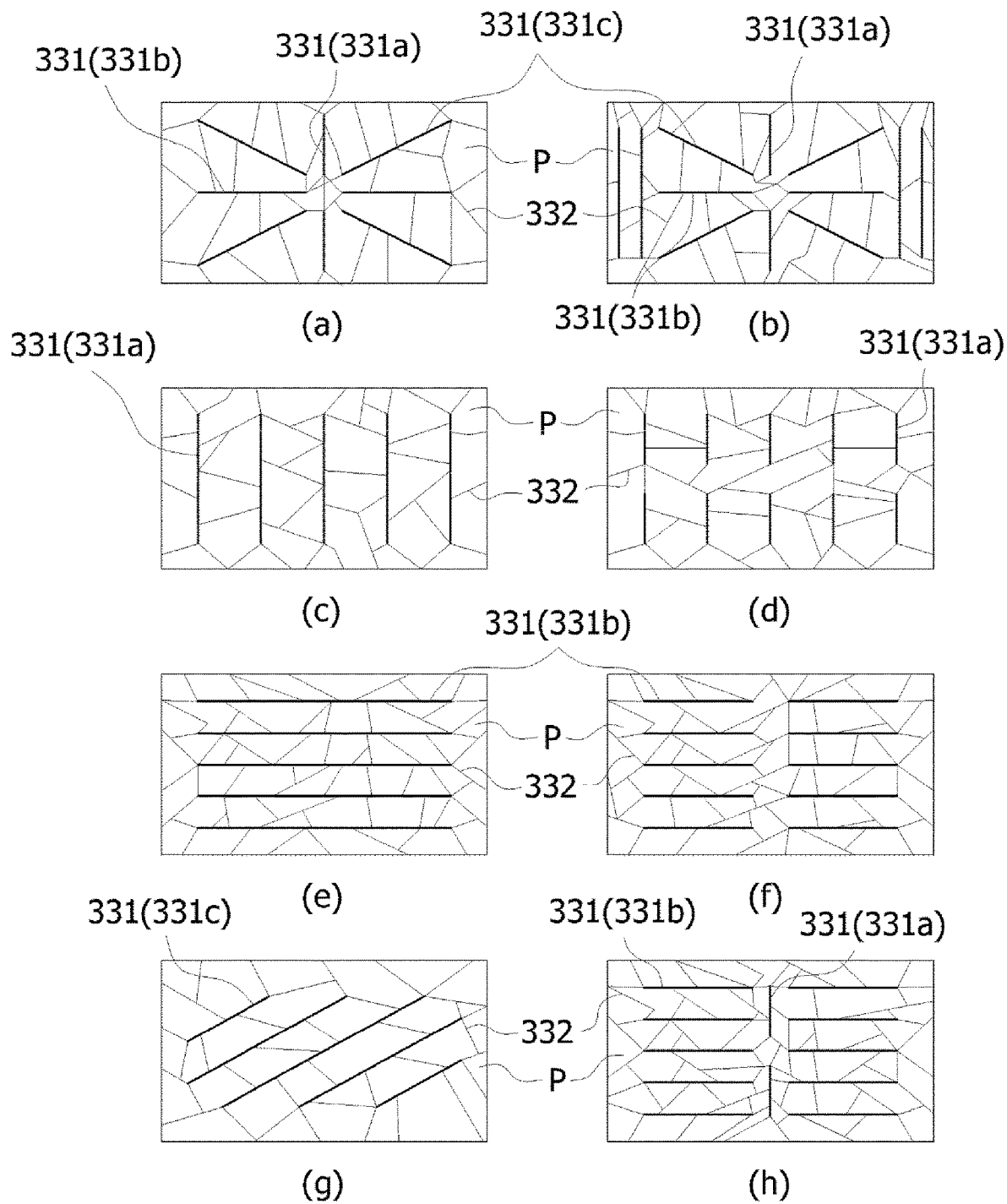
FIG. 16 is a conceptual view of the linear slits formed by the molds of FIG. 15 and the cracks caused by the linear slits.

Accordingly, the shielding sheet 300 separated from the magnetic sheet A through the punching process may be divided into the plurality of pieces P due to the linear slit 331 and the cracks 332 caused by the linear slit 331, as shown in FIG. 13 and FIG. 15.

Here, the plurality of pieces P may have different sizes and shapes and may be randomly formed to have the irregular shapes.

As described above, the method of manufacturing a magnetic field shielding sheet according to the exemplary embodiment of the present disclosure can simplify a manufacturing process because an additional process for forming the shielding sheet 300 formed as the plurality of divided pieces is not necessary but the plurality of pieces P are divided through the process in which the shielding sheet 300 is separated from the magnetic sheet A.

Here, in a case that the shielding sheet 300, which is an end product, includes the release film 320 attached to at least one surface thereof with the adhesive layer 322 interposed therebetween, the punching the magnetic sheet A to form the shielding sheet 300 (S2) may be performed in a state in which the adhesive layer 322 and the release film 320 are attached to the magnetic sheet A. In this case, the edge blade 22 may pass through both of the adhesive layer 322 and the release film 320 in the punching process.

Accordingly, even when the magnetic sheet A is punched to form the shielding sheet 300 having a predetermined size and the shielding sheet 300 is divided into the plurality of pieces P due to the linear slit 331 formed by the linear blade 24 and the cracks 332 caused by the linear slit 331 at the same time, a state in which the plurality of pieces P are divided from each other may be maintained by the adhesive layer 322.

Accordingly, the shielding sheet 300 manufactured through the method of manufacturing a magnetic field shielding sheet according to the exemplary embodiment of the present disclosure may be formed in a state that the plurality of pieces P are separated from each other. Accordingly, an overall resistance of the shielding sheet 300 may increase, a loss due to an eddy current may decrease such that a Q value increases, and thus a transmission efficiency of an antenna may increase.

Meanwhile, the mold 20 may include the plurality of linear blades 24 disposed inside the edge blade 22. In this case, the plurality of linear blades 24 may be disposed to be spaced a distance from each other and may be disposed not to be connected to each other.

Here, the plurality of linear blades 24 may be disposed in various manners.

For example, the plurality of linear blades 24 may be radially disposed around a virtual center point or disposed in a direction perpendicular or parallel to a width or longitudinal direction of the edge blade 22, as shown in FIG. 15A to 15H. In addition, the plurality of linear blades 24 may also be obliquely disposed at a predetermined angle with respect to the width or longitudinal direction of the edge blade 22. In addition, the plurality of linear blades 24 may also be disposed to have a shape in which two shapes are combined among the above-described three shapes.

Accordingly, the shielding sheet 300 manufactured through the method of manufacturing a magnetic field shielding sheet according to the exemplary embodiment of the present disclosure may include the plurality of linear slits 331 formed in a shape which is the same as that of the plurality of linear blades 24 in an inner region of the shielding sheet 300 in the punching process in which the shielding sheet 300 is formed by the mold 20 having various shapes shown in FIGS. 15A to 15H.

In this case, the plurality of linear slits 331 formed in the inner region of the shielding sheet 300 may be locally formed to be separated from each other and may be formed not to be connected to each other. Accordingly, the shielding sheet 300 may be divided into the plurality of pieces due to the plurality of linear slits 331 and the cracks 332 caused by at least any one of the plurality of linear slits 331 and the edge of the shielding sheet 300 as described above.

As a specific example, the plurality of linear slits 331 including at least one among first slits 331a, second slits 331b, and third slits 331c may be formed in the inner region of the shielding sheet 300, and the plurality of linear slits 331 may be formed in the inner region of the shielding sheet 300 to have various shapes as shown in FIGS. 16A to 16H.

Here, the first slit 331a may be a linear slit formed in a direction perpendicular to a width or longitudinal direction of the shielding sheet 300, and the second slit 331b may be a linear slit formed in a direction parallel to the width or longitudinal direction of the shielding sheet 300. In addition, the third slit 331c may be a linear slit obliquely formed at the predetermined angle with respect to the width or longitudinal direction of the shielding sheet 300a.

Accordingly, the shielding sheet 300 may include the plurality of slits 331 including slits having at least two types among the first slits 331a, the second slits 331b, and the third slits 331c, and the plurality of slits 331 may be formed to be radially disposed around the center point.

In addition, the shielding sheet 300 may include the plurality of slits 331 including slits only having any one type among the first slits 331a, the second slits 331b, and the third slits 331c.

Meanwhile, the number of the linear blades 24 disposed in the inner region of the edge blade 22 in the mold 20 may be suitably changed. Accordingly, in the shielding sheet 300 separated from the magnetic sheet A through the punching process, the total number of the linear slits 331 formed in the inner region of the linear blade 24 may be changed.

Accordingly, in the shielding sheet 300 manufactured through the method of manufacturing a magnetic field shielding sheet according to the exemplary embodiment of the present disclosure, the sizes and the number of pieces P divided due to the linear slit 331 and the generated cracks 332 may be suitably adjusted.

That is, as the number of the linear blades 24 included in the mold 20 increases, the total number of pieces P included in the shielding sheet 300 increases, but the size of each of the pieces P may decrease.

On the contrary, as the total number of the linear blades 24 included in the mold 20 decreases, the total number of pieces P included in the shielding sheet 300 decreases, but the size of each of the pieces P may increase.

Accordingly, in the shielding sheet 300 manufactured through the method of manufacturing a magnetic field shielding sheet according to the exemplary embodiment of the present disclosure, the sizes and the number of the plurality of pieces P included in the shielding sheet 300 may be adjusted according to the total number of the linear blades 24 included in the mold 20. Accordingly, in the shielding sheet 300 manufactured through the method of manufacturing a magnetic field shielding sheet according to the exemplary embodiment of the present disclosure, the permeability of the shielding sheet 300 may be variously changed even when the same manufacturing method is applied thereto.

Meanwhile, in the shielding sheet 300 formed as the plurality of divided pieces P through the above-described manufacturing method, gaps may exist between the pieces P. In addition, in the case in which the shielding sheet 300 is divided into the plurality of pieces P due to the linear slits 331 formed by the linear blade 24 and the cracks 332 caused by the linear slits 331, a surface of the shielding sheet 300 may not be uniform. To solve this problem, a laminating process may also be additionally performed.

That is, by compressing the shielding sheet 300 divided into the plurality of pieces P through the laminating process, a part of the adhesive layer fills the gaps between the pieces P so that the gap can be filled with the adhesive layer and the shielding sheet 300 can be planarized, slimmed, and stabilized.

As a result, since the adhesive agent which fills the gaps between the pieces P surrounds the pieces P, the neighboring pieces P can also be partially or wholly insulated and thus a loss by eddy current can be further reduced.

The magnetic field shielding sheet 300 manufactured through the method of manufacturing a magnetic field shielding sheet according to the exemplary embodiment of the present disclosure may be formed in a shape shown in FIG. 14 or 17.

That is, the magnetic field shielding sheet 300 may be formed as the plurality of divided pieces P, and the plurality of pieces P may include pieces P in which at least some thereof have different sizes and shapes.

Here, in the magnetic field shielding sheet 300, the plurality of pieces P may be formed due to at least one linear slit 331 formed in a thickness direction of the magnetic field shielding sheet 300 and the cracks 332 generated from the linear slit 331 and the edge of the magnetic field shielding sheet 300.

In addition, the adhesive layer 322 may be disposed on at least one surface of the upper surface and the lower surface of the magnetic field shielding sheet 300, and the adhesive layer 322 may be a substrate of which one or both of the surfaces are coated with the adhesive agent.

In addition, the magnetic field shielding sheet 300 may include the release film 320 attached to at least one surface of the upper surface and the lower surface thereof by the adhesive layer 322, and the magnetic field shielding sheet 300 may be formed of the single-layered ribbon sheet including at least one of an amorphous alloy and a nanocrystal alloy, or the multi-layered ribbon sheet attached thereto with the adhesive layer interposed therebetween.

A detailed configuration of the magnetic field shielding sheet 300 will not be described due to being the same as that described in the above-described manufacturing process.

The magnetic field shielding sheet 300 manufactured through the method of manufacturing a magnetic field shielding sheet according to the exemplary embodiment of the present disclosure may be provided as a wireless power receiving apparatus 1000 for wireless power transmission.

Figure 18:
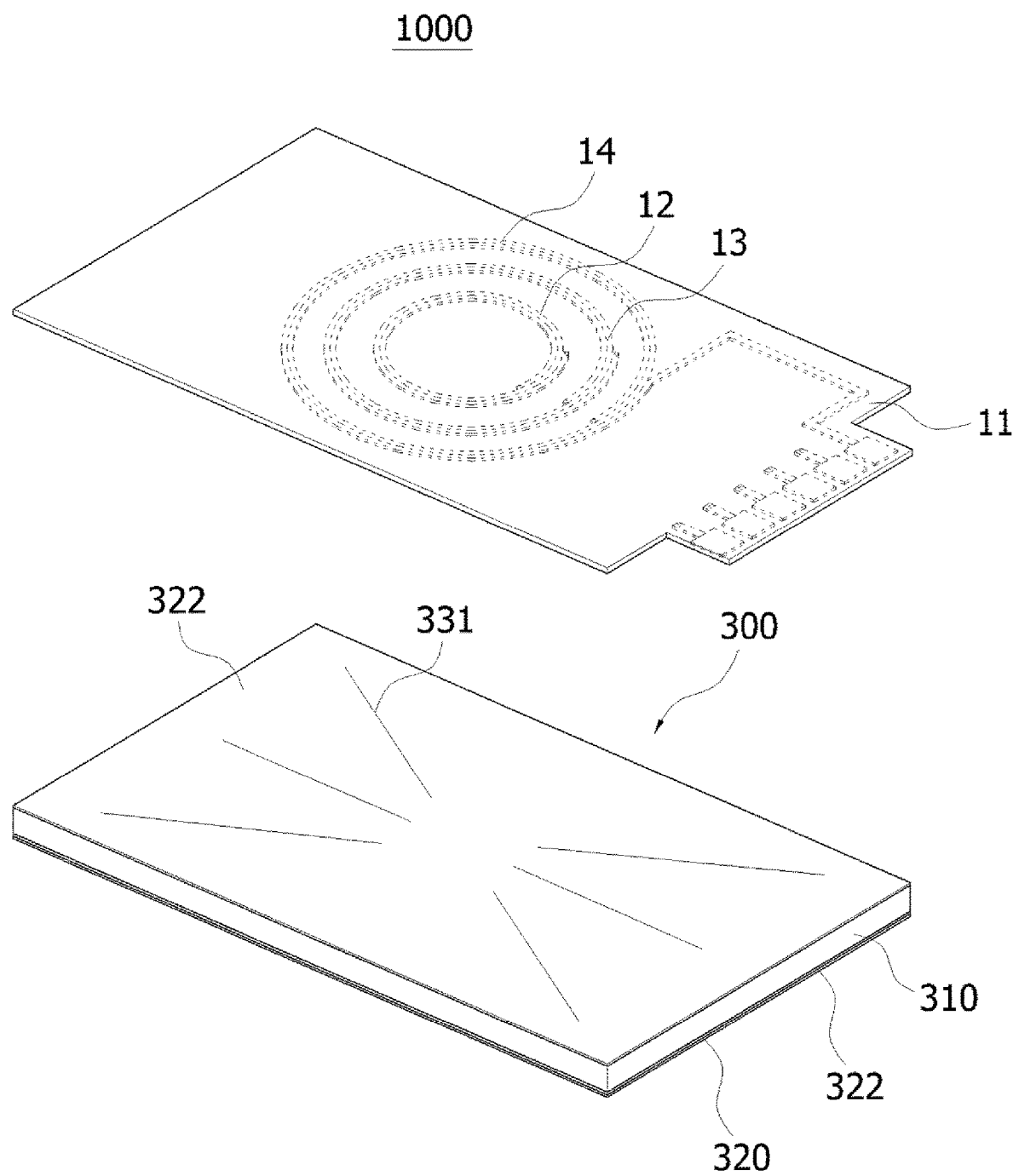
FIG. 18 is a view showing a wireless power receiving module according to an exemplary embodiment of the present disclosure.
Figure 19:
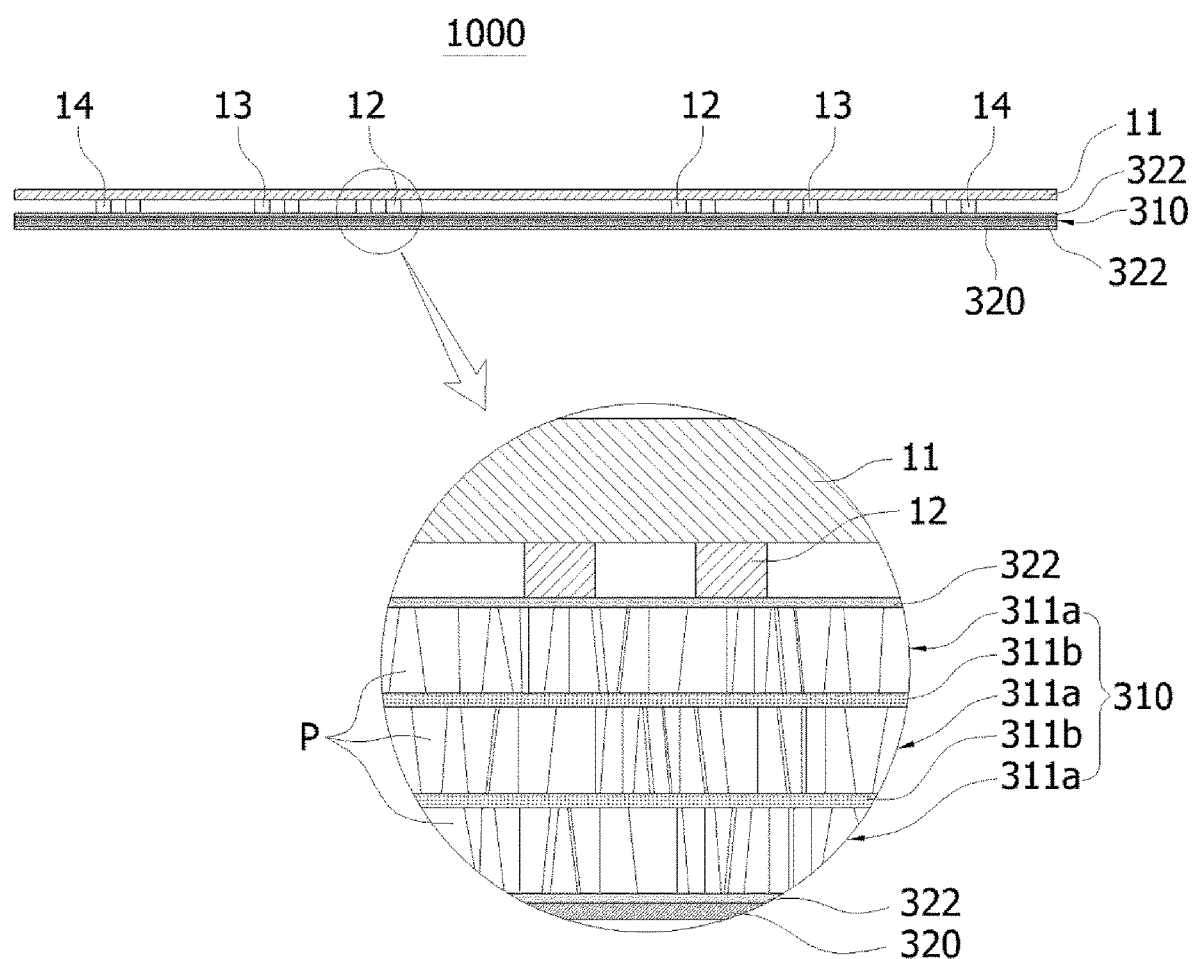
FIG. 19 is a sectional view showing a coupled state of the wireless power receiving module of FIG. 18.

That is, the wireless power receiving apparatus 1000 may include at least one wireless power receiving antenna 12 for wireless charging and the magnetic field shielding sheet 300 disposed at one side of the wireless power receiving antenna 12 to shield a magnetic field and condense the magnetic field in a desired direction, as shown in FIGS. 18 and 19.

Here, the wireless power receiving antenna 12 may be an antenna pattern in which a pattern is formed on at least one surface of a circuit board 11 but is not limited thereto and may be a flat coil in which a conductive member is wound a plurality of times.

In addition, the magnetic field shielding sheet 300 included in the wireless power receiving apparatus 1000 may be a magnetic field shielding sheet manufactured through the above-described manufacturing method. In this case, the magnetic field shielding sheet 300 may be the magnetic field shielding sheet which the release film 320 attached by the adhesive layer 322 is removed from a surface thereof, and the antenna pattern or the circuit board 11 may be directly attached to the adhesive layer 322.

The wireless power receiving apparatus 1000 may also include only the wireless power receiving antenna 12 but may further include various antennas configured to perform various different functions.

For example, the wireless power receiving apparatus 1000 may further include at least any one of an MST antenna 13 for magnetic payment and an NFC antenna 14 NFC in addition to the wireless power receiving antenna 12.

In addition, the wireless power receiving apparatus 1000 may be applied to a portable terminal, such as a portable phone or a tablet personal computer (PC).

As described above, the present disclosure has been described with respect to particularly embodiments. However, the present disclosure is not limited to the above embodiments, and it is possible for one who has an ordinary skill in the art to make various modifications and variations, without departing off the spirit of the present disclosure.

What is claimed is:

1. A method of manufacturing a magnetic field shielding sheet formed as a plurality of divided pieces, the method comprising:
   preparing a magnetic sheet formed of a magnetic material and having a first area; and
   punching the magnetic sheet to form a shielding sheet using a mold such that the shielding sheet having a second area which is narrower than the first area is separated from the magnetic sheet,
   wherein the punching of the magnetic sheet to form the shielding sheet includes forming at least one linear slit in an inner region of the second area using the mold such that the shielding sheet is divided into a plurality of pieces while the shielding sheet is separated from the magnetic sheet to have the second area.

2. The method of claim 1, wherein the mold includes an edge blade having a ring shape in order to form an edge of the shielding sheet and at least one linear blade in order to form the linear slit.

3. The method of claim 2, wherein:
the magnetic sheet includes a release film which is attached to at least any one surface of an upper surface and a lower surface of the magnetic sheet with an adhesive layer interposed therebetween, wherein the adhesive layer include a substrate of which both surfaces are coated with an adhesive agent; and
the punching of the magnetic sheet to form the shielding sheet is performed such that the edge blade passes through both of the magnetic sheet and the release film.

4. The method of claim 1, wherein:
the linear slit has a predetermined length and is formed in a thickness direction of the shielding sheet; and
the shielding sheet is divided into a plurality of pieces due to a crack caused by at least any one of the linear slit and an edge of the shielding sheet.

5. The method of claim 1, wherein:
the shielding sheet includes a plurality of linear slits locally formed in an inner region of the shielding sheet; and
the plurality of linear slits are radially formed around a virtual center point.

6. The method of claim 1, wherein:
the shielding sheet includes a plurality of linear slits locally formed in an inner region of the shielding sheet and spaced apart from each other; and
the plurality of linear slits include at least one or more among a first slit formed in a direction perpendicular to a width or longitudinal direction of the shielding sheet, a second slit formed in a direction parallel to the width or longitudinal direction of the shielding sheet, and a third slit obliquely formed at a predetermined angle with respect to the width or longitudinal direction of the shielding sheet.

7. The method of claim 1, wherein:
the shielding sheet includes a plurality of linear slits locally formed in an inner region of the shielding sheet and spaced apart from each other; and
the plurality of linear slits are formed not to be directly connected to each other.

8. The method of claim 1, wherein the magnetic sheet is a single-layered ribbon sheet including at least one of an amorphous alloy and a nanocrystal alloy or a multi-layered ribbon sheet in which ribbon sheets including at least one of an amorphous alloy and a nanocrystal alloy are stacked with an adhesive layer interposed therebetween.

9. A magnetic field shielding sheet in which a shielding sheet formed of a magnetic material is divided into a plurality of pieces, wherein:
the plurality of pieces include pieces in which at least some thereof have different sizes and shapes; and
the pieces are pieces which are divided by at least one linear slit formed in a thickness direction of the shielding sheet and a crack caused by at least any one of the linear slit and an edge of the shielding sheet.

10. The magnetic field shielding sheet of claim 9, wherein:
the linear slit includes a plurality of linear slits locally formed in an inner region of the shielding sheet; and
the plurality of linear slits are radially formed around a virtual center point.

11. The magnetic field shielding sheet of claim 9, wherein:
the linear slit includes a plurality of linear slits locally formed in an inner region of the shielding sheet and spaced apart from each other; and
the plurality of linear slits include at least one or more among a first slit formed in a direction perpendicular to a width or longitudinal direction of the shielding sheet, a second slit formed in a direction parallel to the width or longitudinal direction of the shielding sheet, and a third slit obliquely formed at a predetermined angle with respect to the width or longitudinal direction of the shielding sheet.

12. The magnetic field shielding sheet of claim 9, wherein:
the linear slit includes a plurality of linear slits locally formed in an inner region of the shielding sheet and spaced apart from each other; and
the plurality of linear slits are formed not to be connected to each other.

13. The magnetic field shielding sheet of claim 9, further comprising an adhesive layer disposed on at least any one surface of both surfaces of the magnetic field shielding sheet,
wherein the adhesive layer includes a substrate of which one or both surfaces are coated with an adhesive agent.

14. The magnetic field shielding sheet of claim 9, further comprising a release film attached to at least any one surface of both surfaces of the magnetic field shielding sheet with an adhesive layer interposed therebetween.

15. The magnetic field shielding sheet of claim 9, wherein the magnetic field shielding sheet is a single-layered ribbon sheet including at least one of an amorphous alloy and a nanocrystal alloy or a multi-layered ribbon sheet in which ribbon sheets including at least one of an amorphous alloy and a nanocrystal alloy are stacked with an adhesive layer interposed therebetween.

16. A wireless power receiving apparatus comprising:
at least one wireless power receiving antenna; and
a magnetic field shielding sheet which is disposed on one surface of the wireless power receiving antenna, shields a magnetic field, and condenses the magnetic field in a desired direction, wherein:
the magnetic field shielding sheet is formed of a shielding sheet which includes a magnetic material and is divided into a plurality of pieces;
the plurality of pieces include pieces of which at least some thereof have different sizes and shapes;
the pieces are pieces which are divided due to at least one linear slit formed in a thickness direction of the shielding sheet and a crack caused by at least any one of the linear slit and an edge of the shielding sheet.

* * * * *